United States Patent
Satoh et al.

(10) Patent No.: US 6,707,079 B2
(45) Date of Patent: Mar. 16, 2004

(54) TWIN MONOS CELL FABRICATION METHOD AND ARRAY ORGANIZATION

(75) Inventors: Kumihiro Satoh, Hopewell Jct, NY (US); Seiki Ogura, Wappingers Falls, NY (US); Tomoya Saito, Poughkeepsie, NY (US)

(73) Assignee: Halo LSI, Inc., Wappingers Falls, NY (US)

( * ) Notice: Subject to any disclaimer, the term of this patent is extended or adjusted under 35 U.S.C. 154(b) by 0 days.

(21) Appl. No.: 10/356,446

(22) Filed: Feb. 3, 2003

(65) Prior Publication Data

US 2003/0143792 A1 Jul. 31, 2003

Related U.S. Application Data

(62) Division of application No. 09/994,084, filed on Nov. 21, 2001, now Pat. No. 6,531,350.
(60) Provisional application No. 60/270,455, filed on Feb. 22, 2001, and provisional application No. 60/278,623, filed on Mar. 26, 2001.

(51) Int. Cl.$^7$ ............... H01L 29/76; H01L 29/94; H01L 31/062; H01L 31/113; H01L 31/119
(52) U.S. Cl. ............... 257/288; 257/296; 257/906
(58) Field of Search ............... 257/68, 288, 296, 257/324, 350, 649, 906

(56) References Cited

U.S. PATENT DOCUMENTS

| | | |
|---|---|---|
| 5,851,881 A | 12/1998 | Lin et al. ............... 438/261 |
| 6,054,734 A | 4/2000 | Aozasa et al. ............... 257/315 |
| 6,166,410 A | 12/2000 | Lin et al. ............... 257/324 |
| 6,177,318 B1 | 1/2001 | Ogura et al. ............... 438/267 |
| 6,255,166 B1 | 7/2001 | Ogura et al. ............... 438/257 |
| 6,459,622 B1 * | 10/2002 | Ogura et al. ............... 365/185.28 |
| 6,531,350 B2 * | 3/2003 | Satoh et al. ............... 438/197 |

OTHER PUBLICATIONS

Co–pending U.S. Patent App. Ser. No. 09/595,059 (Halo–99–002) to Ogura et al., Filed on Jun. 16, 2000, "Nonvolatile Memory Cell, Operating Method of the Same and Nonvolatile Memory Array".

* cited by examiner

*Primary Examiner*—David Nhu
(74) *Attorney, Agent, or Firm*—George O. Saile; Stephen B. Ackerman; Rosemary L. S. Pike

(57) ABSTRACT

Presented in this invention is a fabricating method and its array organization for a high-density twin MONOS memory device integrating a twin MONOS memory cell array and CMOS logic device circuit. The invention consists of two fabrication methods, i) Simultaneous definition of memory gate and logic gate, thus improving the process integration scheme for easier and more reliable fabrication.
ii) Bit line crosses word gate and control gate. The invention focuses on lowering parasitic sheet resistances to enable high speed while maintaining low manufacturing cost. The twin MONOS cell stores memory in two nitride memory cell elements underlying two shared control gates on both sidewalls of a select gate. The method is applicable to a device with a flat channel and/or a device having a step channel.

Two embodiments of the present invention are disclosed.

19 Claims, 30 Drawing Sheets

TWIN MONOS CELL FABRICATION METHOD AND ARRAY ORGANIZATION

This is a division of patent application Ser. No. 09/994,084, filing date Nov. 21, 2001, now U.S. Pat. No. 6,531,350, Twin Monos Cell Fabrication Method And Array Organization, assigned to the same assignee as the present invention.

The instant application claims priority to U.S. Provisional Application Ser. No. 60/270,455 filed on Feb. 22, 2001 and U.S. Provisional Application Ser. No. 60/278,623 filed on Mar. 26, 2001, which are herein incorporated by reference.

BACKGROUND OF THE INVENTION (1) Field of the Invention

The Invention relates to methods of fabricating high-density twin MONOS (Metal/polysilicon Oxide Nitride Oxide Silicon) memory devices integrating CMOS control logic, suitable for various architectures.

(2) Description of Related Art

Twin MONOS structure was introduced in the U.S. Pat. No. 6,255,166 issued on Jul. 3, 2001 to Seiki Ogura, and a variation is taught in co-pending U.S. patent application Ser. No. 09/595,059 (Halo-99-002) to Ogura et al, filed on Jun. 16, 2000. U.S. Pat. Nos. 6,166,410 to Lin et al and U.S. Pat. No. 6,054,734 to Aozasa et al show MONOS cells with dual gates and integrated array and logic processes. U.S. Pat. No. 5,851,881 to Lin et al and U.S. Pat. No. 6,177,318 to Ogura et al show MONOS memory devices.

SUMMARY OF THE INVENTION

Presented in this invention is a fabricating method for high-density twin MONOS memory devices integrating CMOS logic transistors into various array formations. The invention consists of the following fabrication methods:

i) Simultaneous definition of memory gate and logic gate, thus improving the process integration scheme for easier and more reliable fabrication.

ii) Twin MONOS array in which bit line crosses word gate line and control gate. The invention, comparing to co-pending patent application Ser. No. 09/595,059 (Halo99-002) where bit line and control gate are perpendicular to word line, focuses on lowering parasitic sheet resistances to enable high speed while maintaining low manufacturing cost. The twin MONOS cell stores memory in two nitride memory cell elements underlying two control gates on both sidewalls of a shared select (word) gate. The method is applicable to a device with a flat channel and/or a device having a step channel under control gate.

iii) Twin MONOS array architecture in which the shared bit line in adjacent cells in ii) is separated by shallow trench isolation (STI) and featured with individual contact to bit by metal line. The fabrication method can utilize the method in ii). This is a derivative of ii).

iv) Twin MONOS architecture in which one side of bit line is parallel to word and control gate lines and the other side of bit line is perpendicular to word and control gate lines. The contact process for the bit line perpendicular to word and control gate utilizes salicided bit diffusion line or tungsten plugged line. This is another form of partial usage of this new concept of bit line perpendicular to control gate in (ii)

Two embodiments of the present invention are disclosed.

1) The unique features of the first embodiment are a salicided bit line, cap nitride on a memory gate, and field implant isolation without STI. The word line crosses the bit line and the control gate.

1-1) The memory gate image and the logic (peripheral) gate are defined by a critical mask, where feature size is the smallest provided by the lithography tool in use.

1-2) Memory gates with cap nitride and logic gates with no cap nitride are simultaneously formed by a reactive ion etch. To achieve this one time etch, Gate stack structure prior to a mask process from top to bottom is: oxide/nitride/polysilicon/gate oxide in the memory area and nitride/oxide/polysilicon/gate oxide in the logic area.

The resist image transfer RIE stops at the polysilicon surface. The resist is stripped and the hard mask (oxide) is used for the polysilicon RIE.

An etch rate requirement for each layer at polysilicon RIE process is: polysilicon~nitride>>oxide. This is achievable with an ambient of $CF_4/O_2$ for the bulk etch and $HBr/O_2/Cl_2$ for the end point etch.

1-3) A boundary of the memory area and the logic area is placed on the cap nitride at the memory side so as not to leave a polysilicon spacer on the logic side.

1-4) DSW (disposal side wall) process is implemented to achieve an ultra short channel impurity profile in the memory area. As an option, a half cut ONO composite layer is formed under the control gate utilizing DSW as an etching mask. The bottom oxide in the logic area used for DSW formation in the memory area is conserved and used as an etch stop layer to remove the sidewall polysilicon.

1-5) ISSG (in-situ steam generation) is used for an ONO composite layer formation. The bottom oxide growth with ISSG provides a much smaller bird's beak compared to a conventional thermal oxide growth under the word gate. This improves significantly the read current. ISSG grows oxide not only on silicon but also on nitride. The growth rate on nitride is 0.6 times that on single crystal silicon at 950 to 1000° C. Then the oxide grown on the cap nitride isolates it from a nitride film of the ONO composite layer. This provides better insulation between the word gate and the control gate as well as less concern about word line to word line shorts. A nitride of the ONO composite layer is deposited by CVD after $NH_3$ treatment at 850° C. ISSG is also used to grow a top oxide by oxidizing the nitride. Since the oxide layer formed by oxidation of nitride is better quality compared to a deposited CVD oxide film, memory retention time is improved as well as improving program/erase characteristics.

1-6) The vertical reactive etch of polysilicon to form the memory control gate must be subjected to a long RIE breakthrough of the ONO insulation into silicon. At the completion of memory fabrication, the insulator between the control gate and the word gate depends on the height. When the top of the control gate is higher than the boundary of nitride and polysilicon, the insulator thickness gets thinner while removing the cap nitride. Therefore, the top control gate polysilicon has to be lower than the adjacent word gate nitride boundary. The memory bit line and source/drain area are protected by resist etch back process to prevent the etch from breaking through to the substrate during the first half of the etch. The logic source/drain region is defined by using the polysilicon spacer formed during memory control gate formation. The polysilicon spacer in the logic area is removed by CDE after source/drain ion implantation.

1-7) ISSG oxidation follows to recover RIE damages in the ONO composite layer and turn the remaining ONO nitride to oxide in the logic area.

1-8) About 200 Angstroms of oxide is deposited prior to memory source/drain implant to prevent ion implantation damage of the ONO composite layer.

1-9) The memory bit line, the memory control gate, the logic gate, and the logic diffusion are salicided to lower their resistances. About 30 to 40 nm of BPSG is deposited conformally to keep enough of an isolation gap between the memory control gate and the memory bit line. Using BARC (bottom anti-reflective coating)/resist etch back, the BPSG over the control gate is removed by a wet etch to expand an exposed area of the memory control gate. The salicidation area is defined by a subsequent oxide spacer etch.

1-10) About 5000 Angstroms of a thick oxide is deposited over the salicided structures. About 1500 to 2000 Angstroms of nitride is deposited and a dummy pattern is left in the logic area as an etch stop for CMP.

2) The second embodiment differs from the first embodiment in the following aspects: Polycide gate such as stack of Tungsten/Tungsten-nitride/polysilicon or polysilicon gate, cap nitride, STI isolation, local wiring (long contact) process, and self aligned contact and metal bit line. The bit line crosses the word line and control gate. Adjacent bits isolated by STI are alternately connected by the long contact or adjacent bits are connected on the rectangular STI mask.

2-1) STI image is printed as a line shape instead of a rectangular shape to free from corner rounding. The corners of the rectangular STI on a mask are rounded through a lithography process as shown in FIG. 6A. It may generate additional leakage concerned with overlay misalignment as shown in FIG. 6A-2. In this invention, STI and active area are printed as line and space to avoid the leakage effect due to the corner rounding and overlay misalignment. Adjacent four memory bits are connected to each other by a rectangular shape contact instead of a common diffusion area and a square contact. Active lines running parallel are connected at local wiring (long contact) process to be equivalent to the island shape.

2-2) Memory and logic (peripheral) gates are defined by one critical mask.

2-3) The gate structure is:

cap nitride—W/WN—polysilicon—gate oxide

Since a silicon oxide on the W/WN sidewall can cause breakdown voltage, the sidewall must be wrapped in silicon nitride to avoid formation of silicon oxide. The resist image is printed on the gate stack by using a conventional lithography process and transferred into the cap nitride to the W/WN, stopping at the polysilicon surface, followed by photoresist stripping with $O_2$ ashing. About 100 Angstroms of nitride is deposited to wrap the W/WN, followed by vertical reactive ion etching of the polysilicon. Memory and logic gates are printed and etched by a conventional CMOS process.

2-4) A boundary of the memory area and the logic area is placed on the cap nitride at the memory side so as not to leave a polysilicon spacer on the logic side.

2-5) DSW process is implemented to achieve an impurity profile for an ultra short channel in the memory area and to offset the nitride edge from N+ region by N− region under control gate for better retention and endurance. If the nitride cut by DSW is not required because of forgiven requirement in endurance, the DSW process is optional.

2-6) ISSG (in-situ steam generation) is used for an ONO composite layer formation. The bottom oxide growth with ISSG provides a much smaller bird's beak compared to a conventional thermal oxide growth under the word gate. This improves read current extraordinarily due to minimizing polysilicon bird's beak during the oxidation. ISSG grows oxide not only on silicon but also on nitride. The growth rate on nitride is 0.6 times that on single crystal silicon. A nitride of the ONO composite layer is deposited by CVD after $NH_3$ treatment at 850° C. ISSG is also used to grow a top oxide by oxidizing the nitride. Since the higher quality of ISSG oxide against CVD oxide reduces control gate leakage from nitride as compared to a deposition film, memory retention time is improved.

2-7) The vertical reactive ion etch of polysilicon to form the memory control gate is prolonged to lower the height to half of the word gate. The memory bit line and source/drain area are protected by a resist etch back process to prevent etch breakthrough of the ONO to the substrate during the first half of the etch. The logic source/drain region is defined by using the polysilicon spacer. The polysilicon spacer in the logic area is removed by CDE after the source/drain ion implantation.

2-8) ISSG oxidation follows to recover RIE damages in the exposed edge of the ONO composite layer under control gate polysilicon in the memory area and turn the remaining ONO nitride completely to oxide in the logic area.

2-9) About 200 Angstroms of oxide is deposited prior to memory source/drain implant to prevent ion implantation damage of the ONO composite layer.

2-10) BARC and photoresist are applied over the substrate. The photoresist over the memory area is opened and the logic area is masked with a conventional lithography process followed by BARC/photoresist etch back with $O_2$ RIE and oxide spacer etch to expose the control gate silicon and the word gate silicon. The oxide over the diffusion is protected by the remaining BARC not to expose the diffusion area silicon. After removing the oxide on the logic gate and the logic diffusion, salicidation takes place over all the silicon exposed.

2-11) Self-aligned contact (SAC) is enabled by depositing a thicker nitride than a difference of a width of the control gate and spacer oxide thickness. SAC can reduce cell size, occasionally to be halved.

2-12) Local wiring (long contact) process follows oxide deposition and oxide CMP to connect two active areas having a common contact as mentioned in 2-1. A bar contact to two active areas is opened with SAC. Titanium nitride and tungsten are filled in the bar contact using long contact followed by tungsten CMP.

2-13) A contact hole to connect the local wiring (long contact) and the first metal is opened following oxide deposition. The contact is plugged with titanium nitride and tungsten. Then CMP removes the extra titanium nitride and tungsten. This is followed by a conventional metal interconnect process.

3) The third embodiment differs from the second embodiment in the following aspects; no long contact and no sharing metal bit line by adjacent cells. Adjacent cells isolated by the STI are not bridged as in the second embodiment. The dual metal bit lines cross the word lines per each cell and each metal line contacts every other diffusion bit.

4) The fourth embodiment differs from the second embodiment in the following aspects; alternate continued and STI isolated diffusions parallel to word lines. Using rectangular STI mask or a long tungsten plugged line instead of long contact as in the second embodiment forms the continued diffusion line. The continued diffusion line with tungsten plugged is used as a source line and parallel to the word line and the control gate. A metal bit line contacts diffusion bits on the STI isolated diffusion crossing the word line.

BRIEF DESCRIPTION OF THE DRAWINGS

In the accompanying drawings forming a material part of this description, there is shown:

FIG. 6A-3 illustrates a cross-sectional view of the top view in FIG. 6A-1 of the second embodiment metal bit twin MONOS having a rectangular STI.

FIG. 6B-1 schematically illustrates a top view of the second embodiment, metal bit twin MONOS device, of the present invention, which has long contact and no misalignment between STI and Word gate.

FIG. 6B-2 schematically illustrates a cross-sectional view of the top view in FIG. 6B-1.

FIG. 6C-1 schematically illustrates a top view of the second embodiment; metal bit twin MONOS.

FIG. 6C-2 schematically illustrates an electrical circuit diagram corresponding to the top view in FIG. 6C-1.

DETAILED DESCRIPTION OF THE INVENTION

Figure 5A:
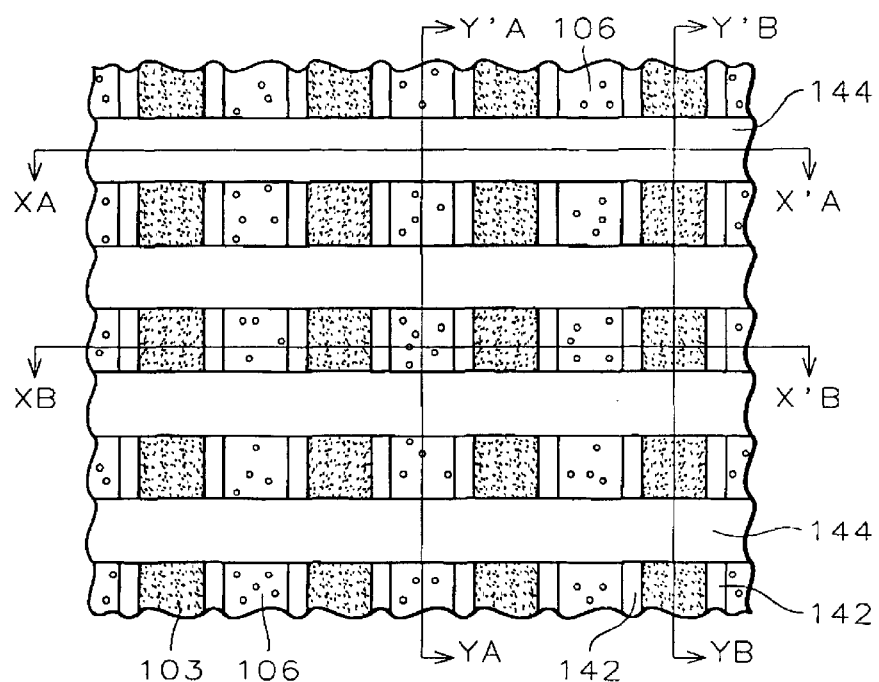
FIG. 5A schematically illustrates a top view of the first embodiment diffusion bit twin MONOS.
Figure 5B:
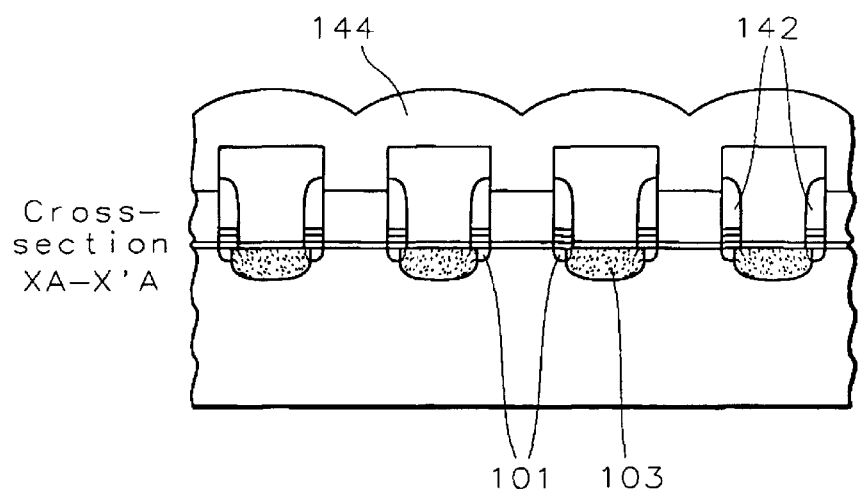
FIGS. 5B through 5E schematically illustrate cross-sectional views of the top view FIG. 5A of the first embodiment diffusion bit twin MONOS.
Figure 5C:
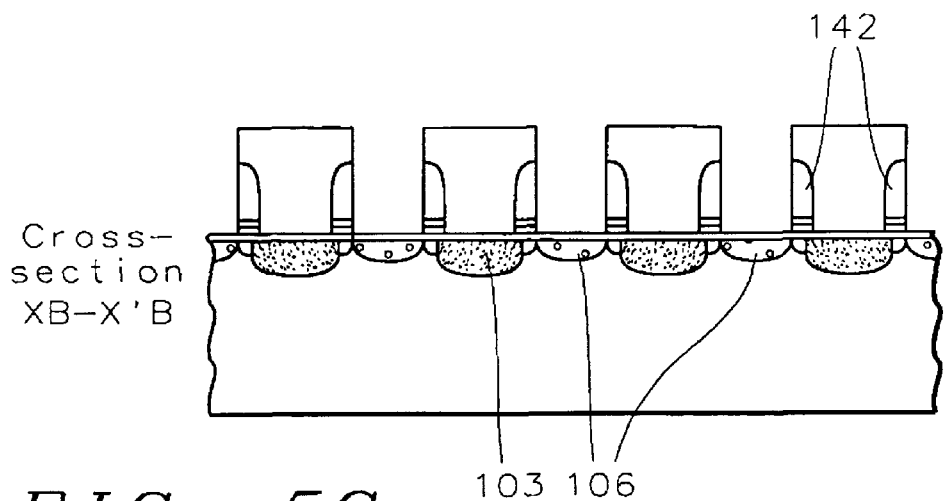
Figure 5D:
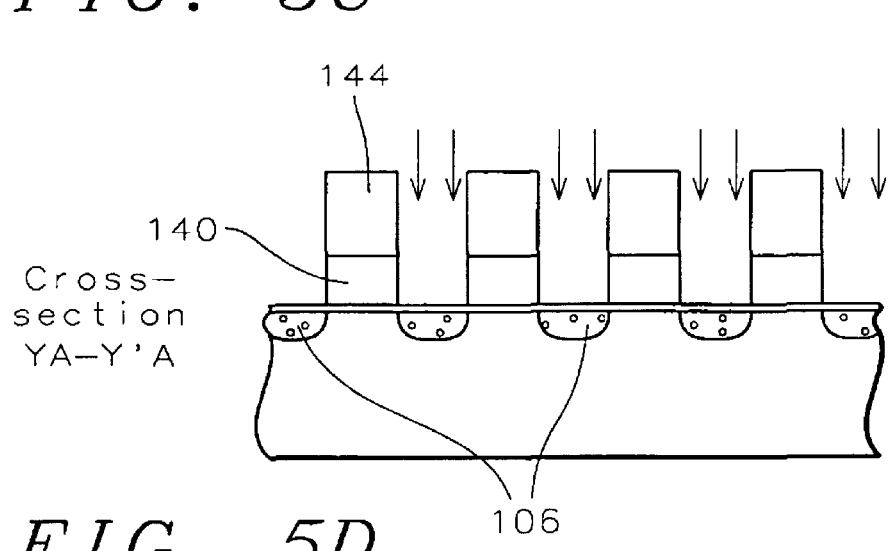
Figure 5E:
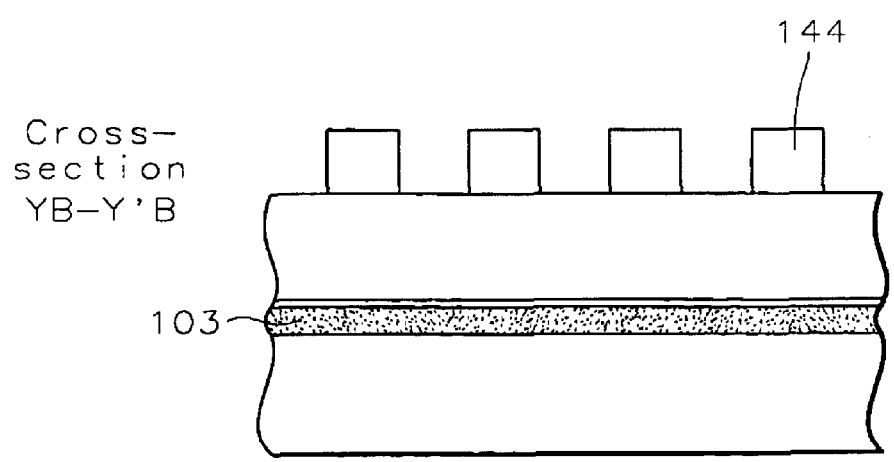
Figure 5F:
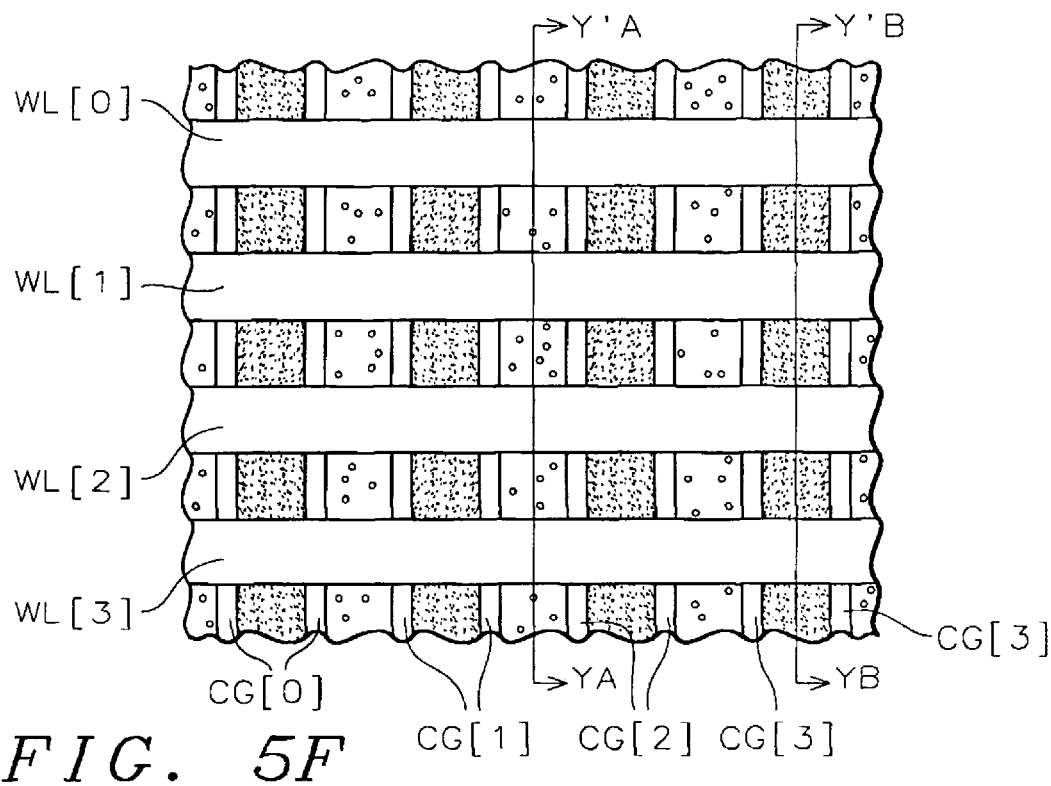
FIG. 5F schematically illustrates a top view of the first embodiment diffusion bit twin MONOS.
Figure 5G:
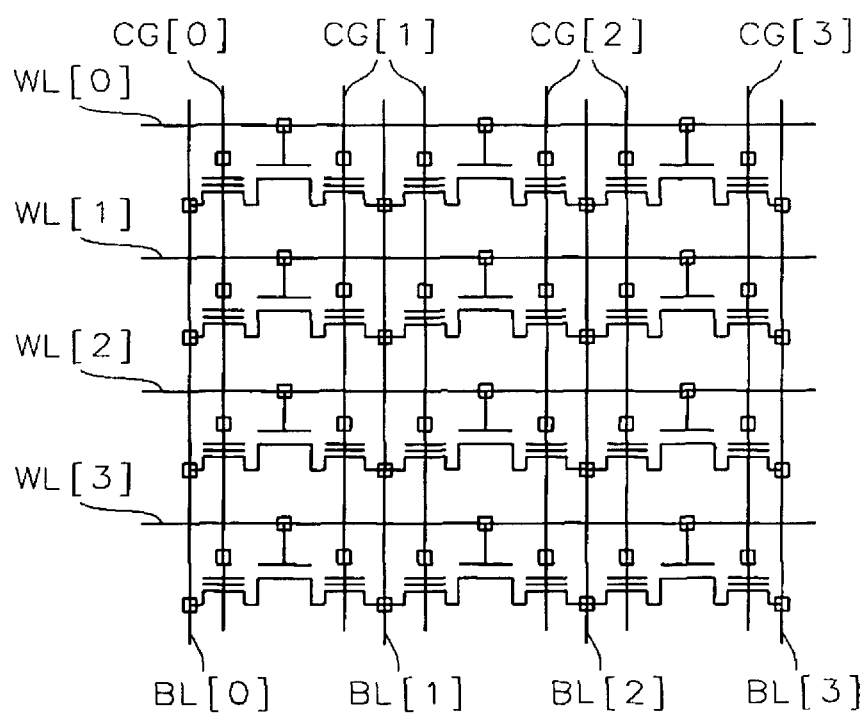
FIG. 5G illustrates a circuit diagram of the first embodiment diffusion bit twin MONOS.

The process of the first embodiment of the present invention is illustrated in FIGS. 1A to 1R and FIGS. 5A through 5L. In the first embodiment, a bit line runs parallel to the control gate and a word line runs perpendicular to the control gate and the bit line as shown in FIGS. 5F and 5C. STI (Shallow Trench Isolation) is not used for the memory cell isolation but is used in CMOS logic and peripheral circuits. The memory cell is isolated by field ion implantation 106 after word line formation as shown in FIGS. 5C and 5D.

Figure 1A:
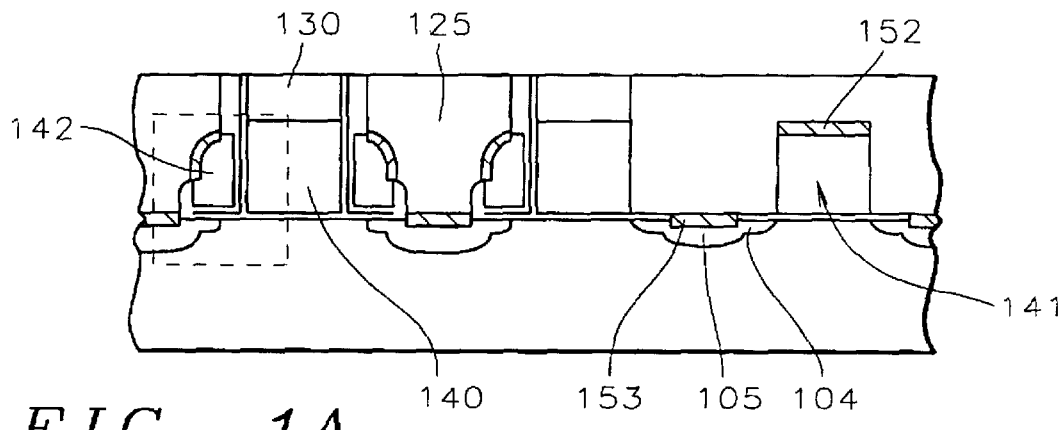
FIGS. 1A through 1C schematically illustrate in cross-sectional representation a completed twin MONOS device fabricated by a first preferred embodiment of the present invention.
Figure 1B:
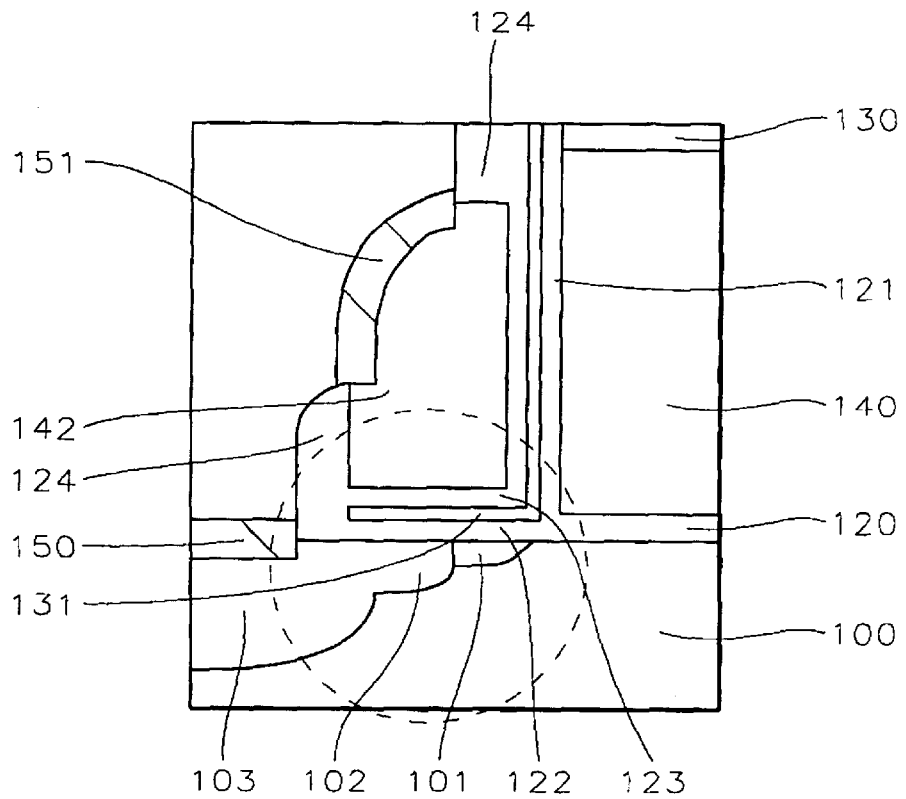
Figure 1C:
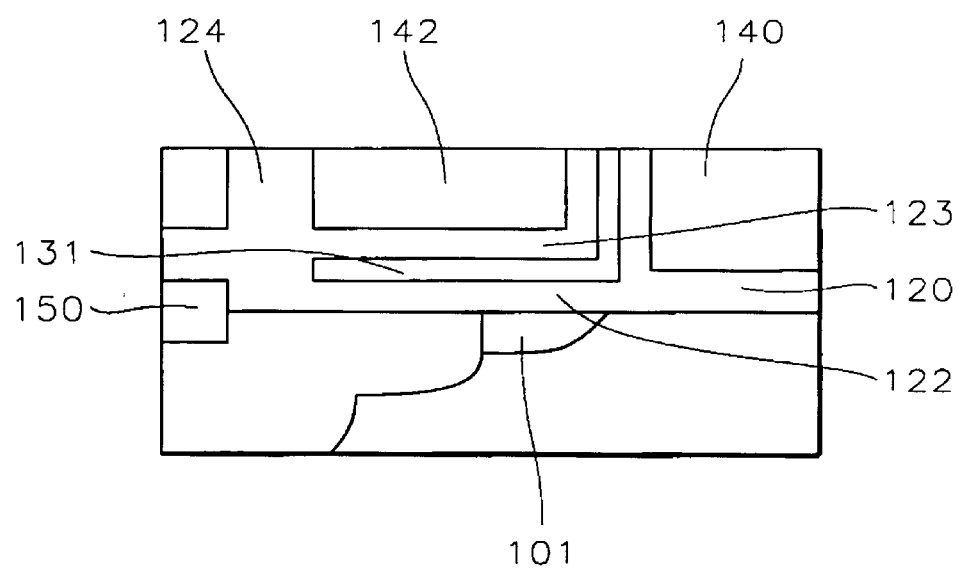

FIGS. 1A through 1C illustrate a completed MONOS device of the first embodiment. A field implant provides memory cell isolation (not shown) in the memory area. A salicided logic gate 152/141 and an adjacent salicided source/drain region 105 are formed in the logic area. In the memory area, a memory gate 140 and an adjacent salicided source/drain region 103 are formed. Control gates 142 are formed on sidewalls of the memory gate 140, isolated from memory gate by an oxide-nitride-oxide (ONO) layer 122/131/123. A salicided word gate 154/144, shown in an orthogonal view in FIG. 1R, contacts the memory gate.

Now, the method of making the MONOS device of the first embodiment will be described. As shown in FIG. 1A, while the cap nitride 130 over the memory word gate is required to define the word line, the cap nitride over the logic gates 141 in logic/peripheral area should be removed to salicide the gates in order to reduce the sheet resistance. STI in the logic area, P-well and N-well are formed first in the semiconductor substrate 100 as in conventional CMOS processing and are not shown in the figures.

Figure 1D:
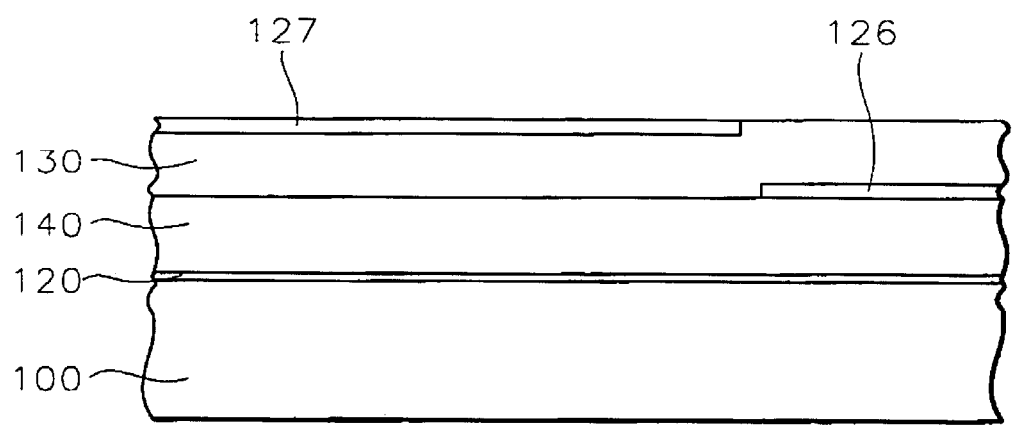
FIGS. 1D through 1H, 1J through 1N, and 1P through 1R schematically illustrate in cross-sectional representation a first preferred embodiment of the present invention.

The word gate 140 of the twin MONOS memory having 100–200 nm of nitride 130 and polysilicon gate 141 in the peripheral and/or logic control circuit without cap nitride are defined simultaneously. The memory gate silicon oxide and low voltage logic gate silicon oxide are formed to a thickness of between about 2 and 10 nm shown in FIG. 1D as 120. A gate silicon oxide thickness for the high voltage logic device is adjusted depending on applied voltage requirements. Then the polysilicon 140 in FIG. 1D is deposited to a thickness of between about 150 and 250 nm by chemical vapor deposition (CVD). A silicon oxide layer 126 in FIG. 1D is deposited by CVD to a thickness of about 30 nm to be used later as an etching stopper over n-/p-MOS during polysilicon etching. The oxide layer over the memory cell array is etched away using lithography mask and dry etching as shown in FIG. 1D. A silicon nitride layer 130 in FIG. 1D is deposited by CVD to a thickness of between about 100 and 200 nm to be used later as an etch-stop layer for chemical mechanical polishing (CMP). A silicon oxide layer 127 in FIG. 1D is deposited by CVD to a thickness of about 30 nm and etched away over the logic area with masking over the memory area. The silicon oxide layer 127 will be used as a hard mask during polysilicon gate definition. Consequently oxide-nitride-polysilicon-gate oxide is stacked in the memory area and nitride-oxide-polysilicon-gate oxide, in the logic area, as shown in FIG. 1D.

Figure 1E:
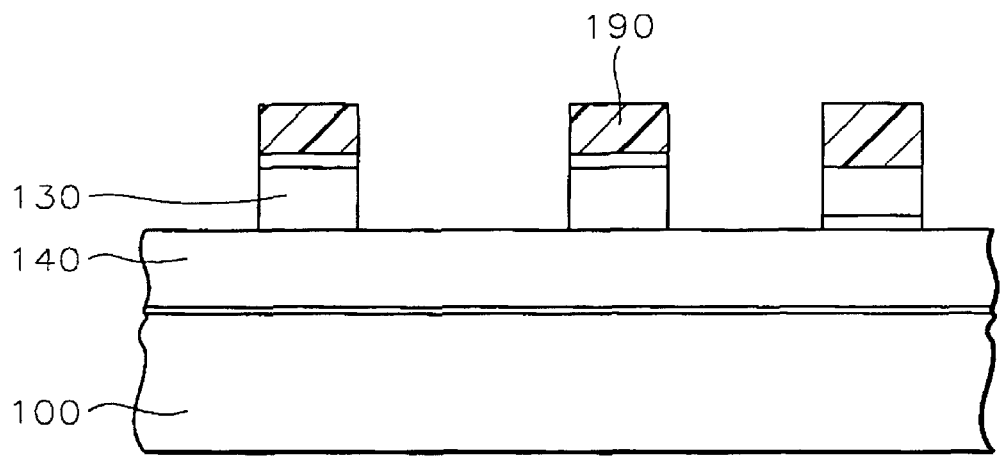
Figure 1F:
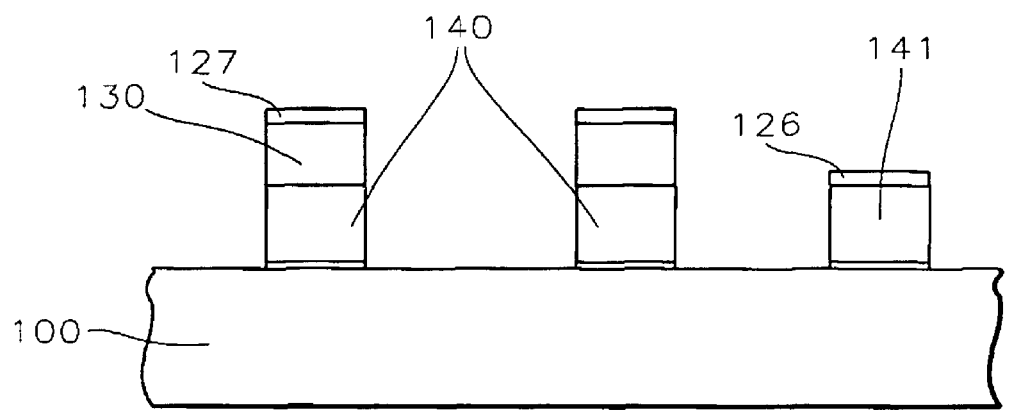

A photoresist image 190 in FIG. 1E is patterned using conventional photolithography over the stack and is transferred into the dielectric films by reactive ion etching (RIE), stopping at the polysilicon surface, followed by photoresist strip by oxygen ashing. Memory and logic gates are formed by polysilicon RIE using the dielectric patterns 126, 127 in FIG. 1F over the polysilicon as an etch mask, where the etch rate of silicon nitride is chosen to be close to that of polysilicon and the etch rate of silicon oxide is much slower than that of polysilicon. The silicon nitride 130 is etched away during polysilicon 140 etching in the logic area and the etching is stopped at the top oxides 126, 127 or at the gate oxide 120. The typical etching ambient is $CF_4/O_2$ for bulk etch and $HBr/O_2/Cl_2$ system for end point to achieve the requirement for the etch rates. The structure obtained at this stage is shown in FIG. 1F. The remaining oxide 120 is gently etched away.

Figure 1G:
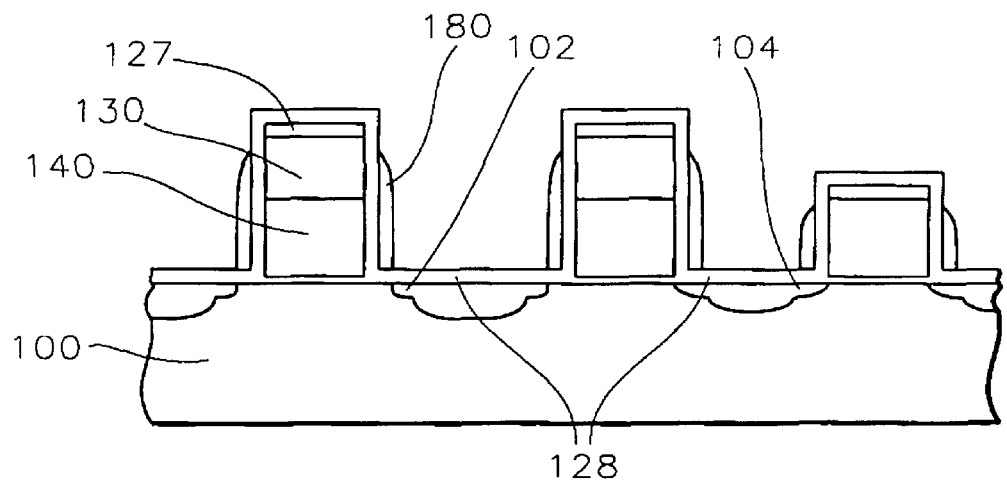
Figure 1H:
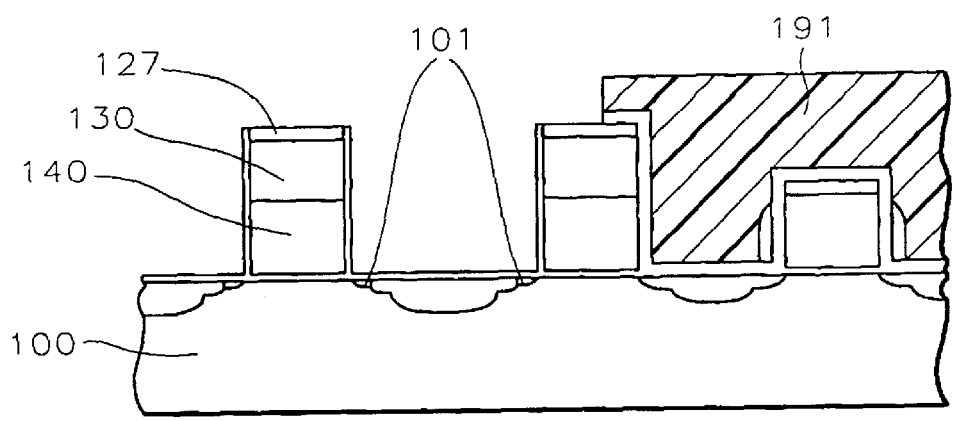

About 10 to 20 nm of silicon oxide 128 in FIG. 1G is deposited by CVD to offset Boron ion implantation 101 in FIG. 1H to adjust the threshold voltage (Vt) under the control gate. LDD (lightly doped drain) ion implantation in the logic area is implanted at this stage using a photoresist mask as in a normal CMOS process to form logic LDD structure 104. The disposable sidewall (DSW) spacer process is formed to define an ultra short channel width in a controlled manner. The thin layer 180 in FIG. 1G, between about 30 and 50 nm, comprising a polysilicon, a silicon nitride or borophosphosilicate glass (BPSG) is deposited conformally and the DSW film is anisotopically etched to form the disposable sidewall spacer on both sides of the memory word gate.

The logic area is covered with photoresist 191 to protect the subsequent LDD ion implantation, where a photoresist boundary between memory and logic is taken on polysilicon at the edge of the memory area as shown in FIG. 1H. An n-type dopant such as Arsenic is implanted into LDD region 102 in FIG. 1G. The typical As implant condition is energy 10 to 20 keV and dose between about 5E13 and 1E14 atoms/cm². After stripping the photoresist mask over the logic area with $O_2$ ashing, the DSW is removed by CDE or wet etch. Masking the logic area with photoresist, p-type dopant is implanted with the offset of the remaining silicon oxide thickness on the word gate sidewall. $BF_2$ is implanted at an energy of 30 keV and dose of between about 1.2 to 2.5 E13 atoms/cm² to form the control gate channel region 101 in FIG. 1H. The oxide 128 in the memory area is gently removed with a wet or dry etch and the photoresist over the logic area is stripped away.

Figure 1J:
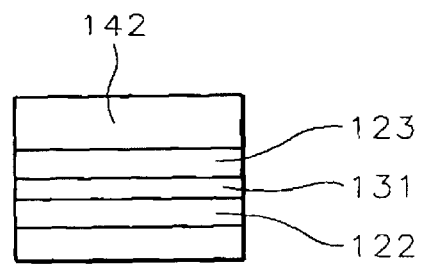

The ISSG (in-situ steam generation) tool recently developed grows silicon dioxide on not only silicon but also on silicon nitride. When the oxide growth rate over single crystal silicon is 1, the oxide growth rate over silicon nitride is 0.6. ISSG oxide quality, as measured by oxide break down voltage, is better than CVD oxide. A composite layer of oxide-nitride-oxide (ONO) 123-131-122 is formed using ISSG oxidation. The bottom oxide 122 in FIG. 1J is grown with ISSG to a thickness of between about 3.0 and 5.0 nm. ISSG reduces bird's beak under the edge of the memory word gate compared to conventional thermal oxide growth. The oxide grown on the cap nitride 130 side wall isolates the cap nitride from the nitride of the ONO composite layer. Pretreatment of the bottom oxide in $NH_3$ ambient, >850° C., provides uniform nitride deposition by CVD. The silicon nitride layer 131 in FIG. 1J deposited by CVD has a thickness of between about 6 and 9 nm. The remaining nitride thickness of the composite layer is reduced to between about 3 and 6 nm after ISSG oxidation. For example, 7.0 nm nitride reduced to 4.5 nm after 4.5 nm ISSG oxidation. 75A Nitride turns to 45A Nitride/45A top oxide after ISSG oxidation.

Figure 1K:
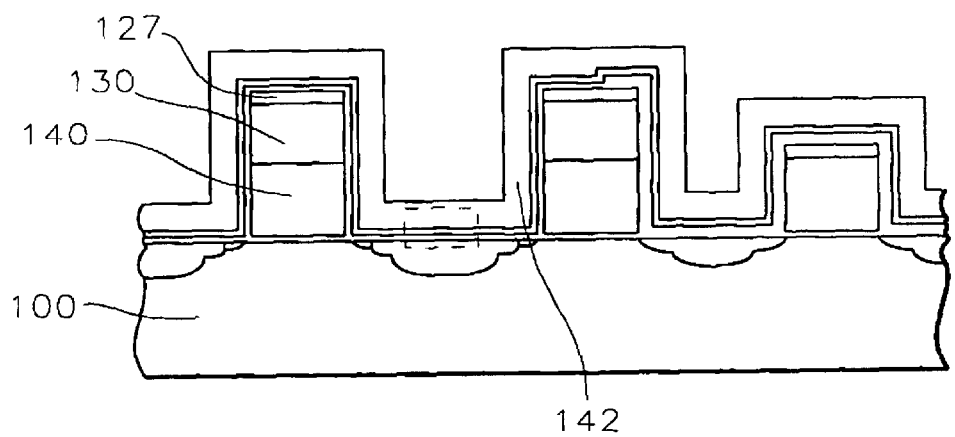

A memory control gate 142 in FIG. 1K is formed as a sidewall spacer of the memory word gate. The control gate height is designed to be lower than the word gate polysilicon. The cap nitride will be removed later and polysilicon will be put in its place. As oxide growth on nitride is much slower than on polysilicon, the dielectric film thickness on the side cap of nitride is not thick enough to stand the required voltages between the control gate and the word gate. To avoid the low breakdown voltage between the filled word gate and control gate, the control gate polysilicon etch is extended considerably lower than the nitride interface, but an extensive over etch will break through the over diffusion area. It is required to protect the diffusion area from breakthrough during the polysilicon spacer etch.

Figure 1L:
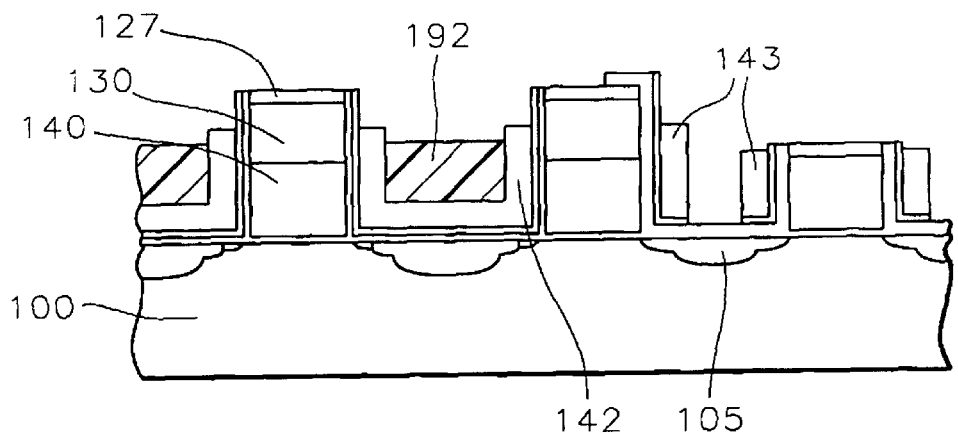

An insitu phosphorus doped polysilicon 142 in FIG. 1K is deposited by CVD to a thickness of about 60 to 100 nm. The memory area is covered with photoresist using conventional photolithography. Since the topology in the memory area is higher than that in the logic area, proper halfway etch of photoresist leaves some photoresist in the trench over the memory area, which protects the diffusion area as shown in FIG. 1L as layer 192. The vertical reactive ion etch removes polysilicon by twice the deposition thickness in the vertical direction. A surface of the ONO composite layer appears and the top oxide is gently removed by oxide RIE stopping at the ONO nitride. Then using a conventional CMOS process, the source/drain regions 105 in FIG. 1L of n-MOS and p-MOS are defined individually by n-type and p-type ion implantation. The polysilicon sidewall 143 in FIG. 1L used as a spacer for the logic source/drain ion implantation is removed from the logic area by isotropical dry etch such as chemical down flow etch (CDE) or wet chemical etch where the memory area is masked by photoresist. The composite ONO layer under the polysilicon sidewall remains after removing the polysilicon. The top oxide is etched away by light wet chemical etch or gentle dry etch. The nitride 132 in FIG. 1M will be oxidized by ISSG later. The photoresist masking the memory area is stripped by $O_2$ ashing.

Figure 1M:
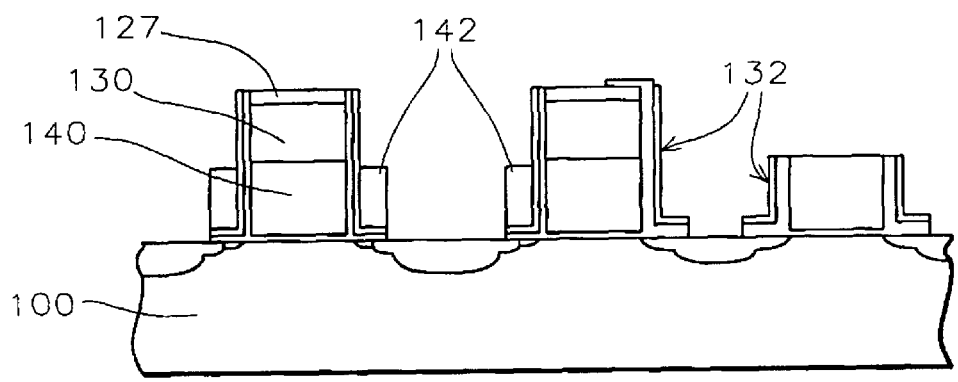
Figure 1N:
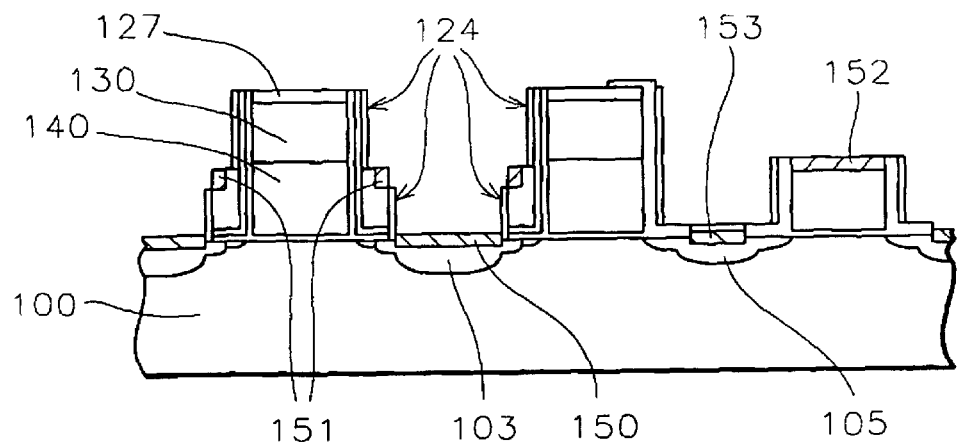

Here the memory control gate and source/drain are defined. The logic area and control gate contact area are masked with photoresist patterned using a conventional photolithography process. The vertical reactive ion etch of polysilicon is continued until the height of the control gate 142 becomes lower than the polysilicon of the word gate as shown in FIG. 1M. The ONO composite layer is subsequently etched away with a vertical reactive ion etch of oxide. After stripping the photoresist covering the logic and control gate contact area by $O_2$ ashing, 6 nm of recovery oxidation with ISSG is performed to recover a damaged ONO by RIE and to change the nitride 132 remaining on the surface completely into oxide. Another about 20 nm of oxide 124 in FIG. 1N is deposited to prevent ion implantation damage on the gate edge oxide. Masking the logic area with photoresist, an n-type memory dopant ion such as Arsenic is implanted into the source/drain region 103 in FIG. 1N. The photoresist is stripped by $O_2$ ashing.

An oxide vertical ion etch follows stripping the resist used as the memory source/drain ion implantation mask in order to expose each silicon surface. The memory diffusion (source/drain) area 103 and the control gate are isolated by about 20 nm of oxide sidewall 124 in FIG. 1N and the control gate is protected by about 20 nm oxide. If thicker isolation 124 is required, an option using BPSG and BARC (bottom arc coat) etch back is inserted. BPSG is deposited by CVD to a thickness of 20 to 40 nm. BARC and photoresist are subsequently coated over the BPSG to protect BPSG in the memory diffusion and logic area. The photoresist in the memory area is developed out and $O_2$ RIE etches back the BARC until the memory control gate surface appears. The exposed BPSG is removed with a wet etch followed by $O_2$ RIE to strip the photoresist and BARC. BPSG over the control gate is removed and that on the control gate side wall is conserved. The vertical oxide RIE maintains the isolation over the control gate by 20 nm and the isolation gap between the control gate and the diffusion increases by the BPSG thickness.

A salicidation metal such as cobalt, titanium, etc is subsequently deposited by sputtering followed by a salicide formation anneal at 650–750° C. The formation anneal promotes the metal to react with the silicon turning into a metal-silicon alloy. The metal not touching the silicon does not react with the underlying material. The unreacted metal is stripped with an appropriate chemical such as $H_2O_2$/ sulphuric acid. The salicide is not stable enough just after the formation anneal, so another anneal, called a conversion anneal, is performed to stabilize the salicide. Then memory diffusion 150 in FIG. 1N, the Control gate 151, the Logic gate 152 and the Logic diffusion 153 are now all salicided.

Figure 1P:
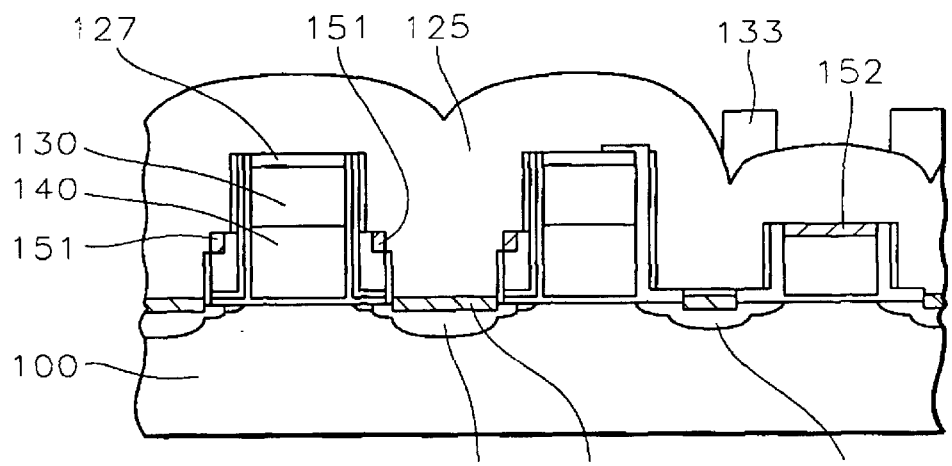

A thick oxide 125 in FIG. 1P is deposited by CVD to a thickness of about 500 nm and planarized by CMP (chemical mechanical polish) to the cap nitride layer 130. There is a concern about CMP reaching the logic gate surface. Since the pattern density of the logic area is much smaller than the memory area, oxide thickness over the logic gate is thinner than the memory. Since the gate height of the logic is 150 nm lower than the memory, the logic area is susceptible to dishing and gate erosion during CMP. A nitride dummy pattern process in the logic area is inserted prior to CMP to protect a gate in an isolated area. A thickness of between about 100 and 150 nm of nitride is deposited. A nitride pattern 133 in FIG. 1P is formed such as a wedge on v-shaped oxide in the logic area overlying the logic source/drain. These nitride islands prevent CMP dishing over the logic area. The remaining wedge after CMP in the oxide area is removed when the memory cap nitride is removed.

Figure 1Q:
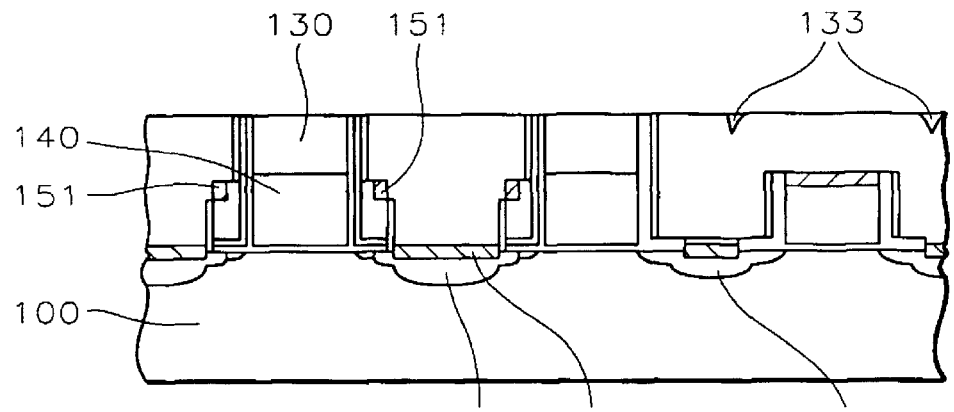

The memory word line process follows the CMP planarization. After removing the memory cap nitride 130 and nitride wedge 133 in FIG. 1Q by a wet etch such as hot phosphoric acid, polysilicon is deposited to a thickness of between 150 to 250 nm. The word gate pattern is printed on the polysilicon with a conventional lithography process and the resist image is transferred into the polysilicon 144 in FIG. 1R where word polysilicon along the orthogonal direction is etched away as shown in FIGS. 5B and 5C.

The polysilicon etching reaches to the gate oxide 120. Then a light oxidation (5–10 nm) is applied, then Boron ($BF_2$ 20 keV~30 keV, 2E12~1E13 atoms/cm$^2$) is implanted in the field region 106 as shown in FIGS. 5C and 5D.

Figure 5H:
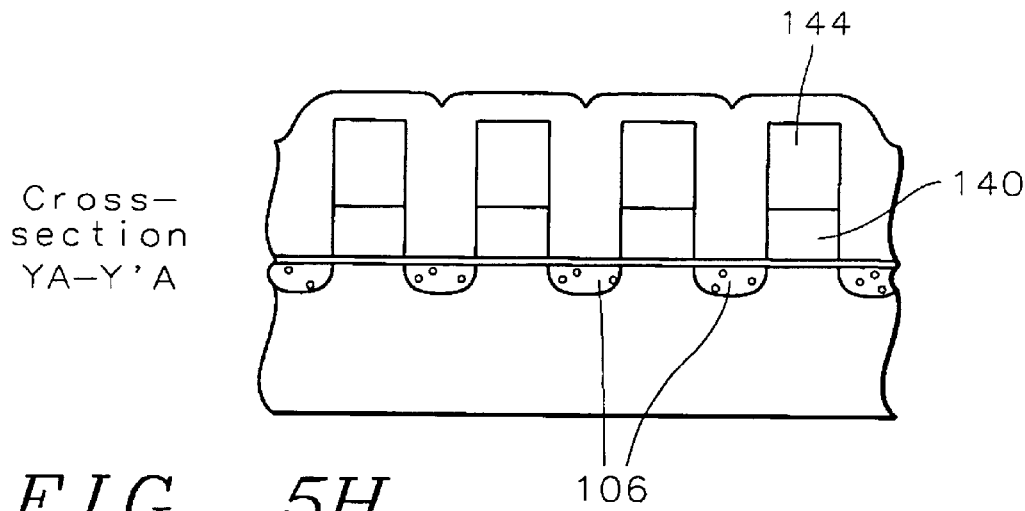
FIGS. 5H, 5J, 5K, and 5L schematically illustrate cross-sectional views of the top view in FIG. 5F of the first embodiment diffusion bit twin MONOS.
Figure 5J:
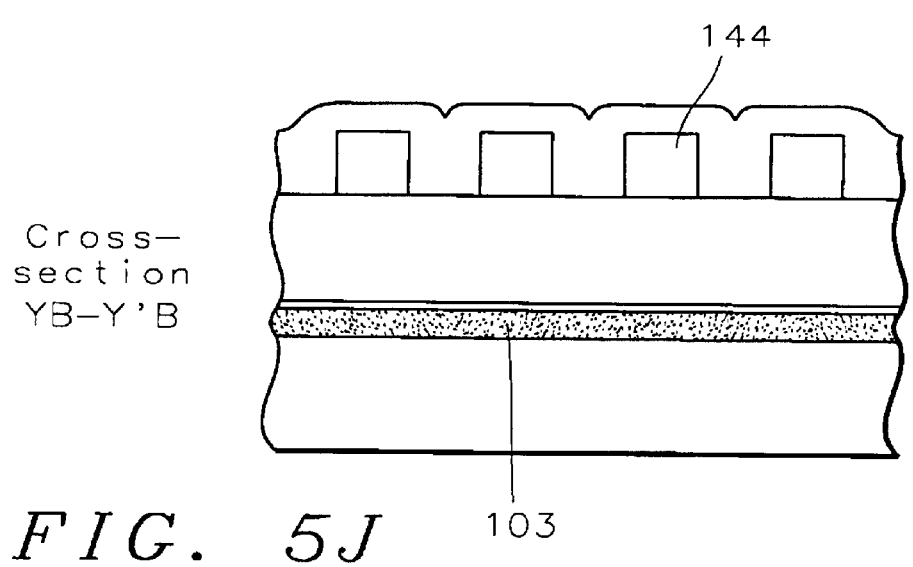

The CVD oxide (500 nm) is deposited to fill the gap between word gates. The RIE etch of 500 nm exposes the word gate polysilicon leaving the word gap filled with the oxide as shown in FIGS. 5H and 5J.

Figure 1R:
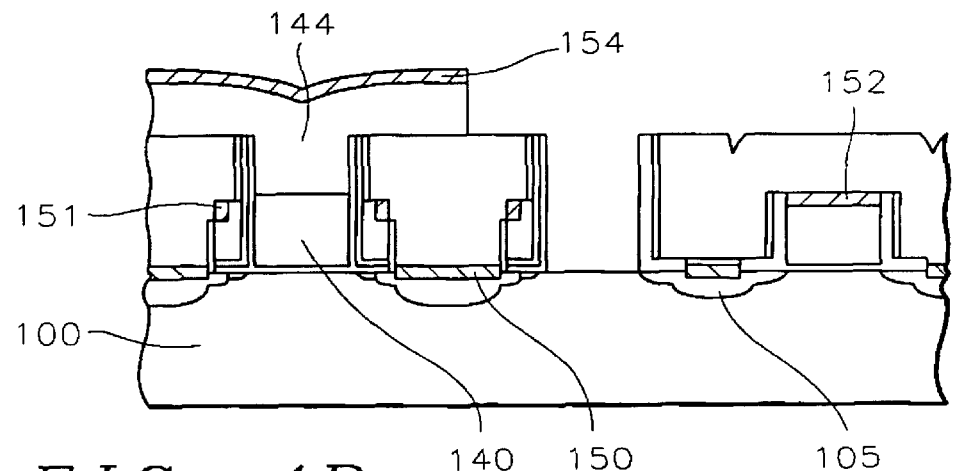
Figure 5K:
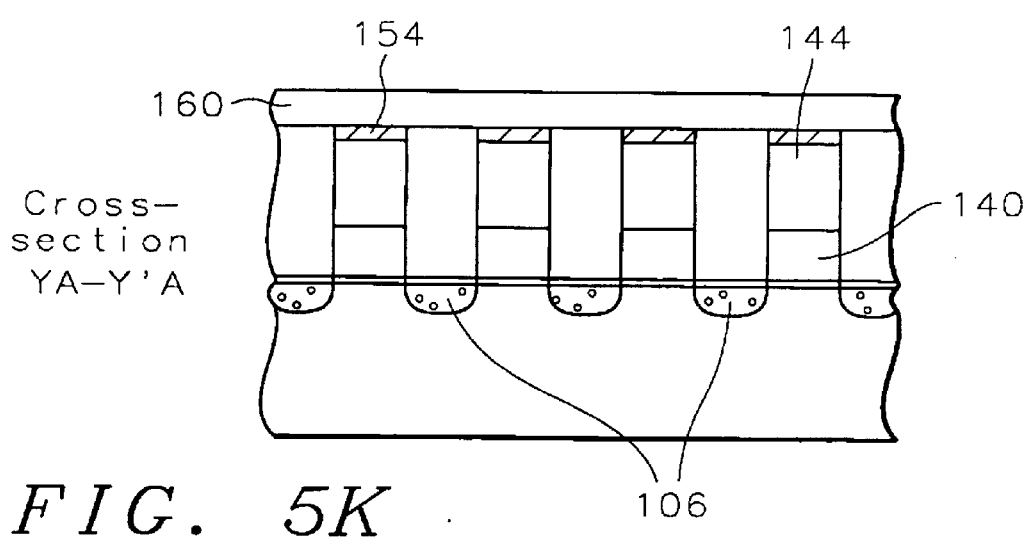
Figure 5L:
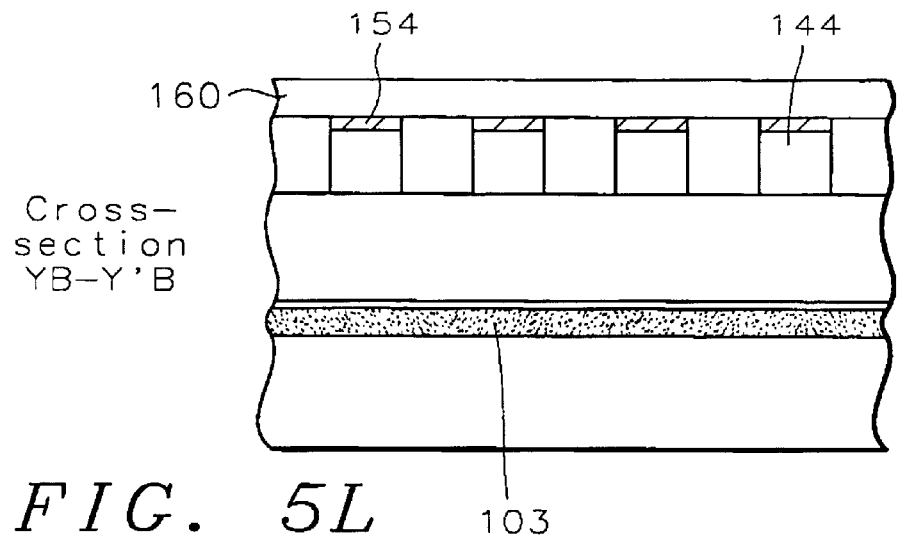

Then the word line is salicided by a conventional CMOS salicidation process as in FIG. 1R as 154. As an option, polysilicon 144 on top of base word gate polysilicon 140 can be replaced with W/Polysilicon~WSi/polysilicon instead of polysilicon 144. Then thick oxide 160 is deposited by CVD to fill the gap between the word polysilicon 144 as well as to deposit on top of the word gate polysilicon 144, as shown in FIGS. 5K and 5L.

Hereafter the process is followed by the conventional interconnect/metal wiring process.

Figure 3A:
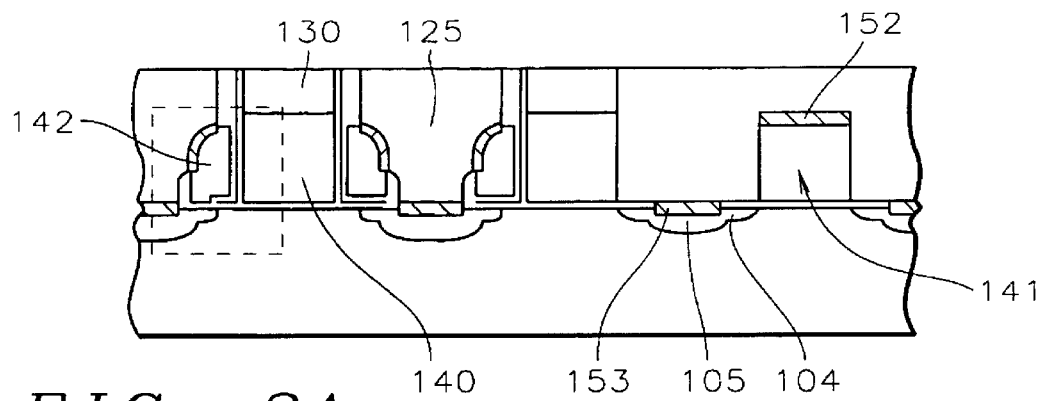
FIGS. 3A and 3B schematically illustrate in cross-sectional representation a completed twin MONOS device with the ONO defined by DSW and offset by N region to N+ region as an alternative first preferred embodiment of the present invention.
Figure 3B:
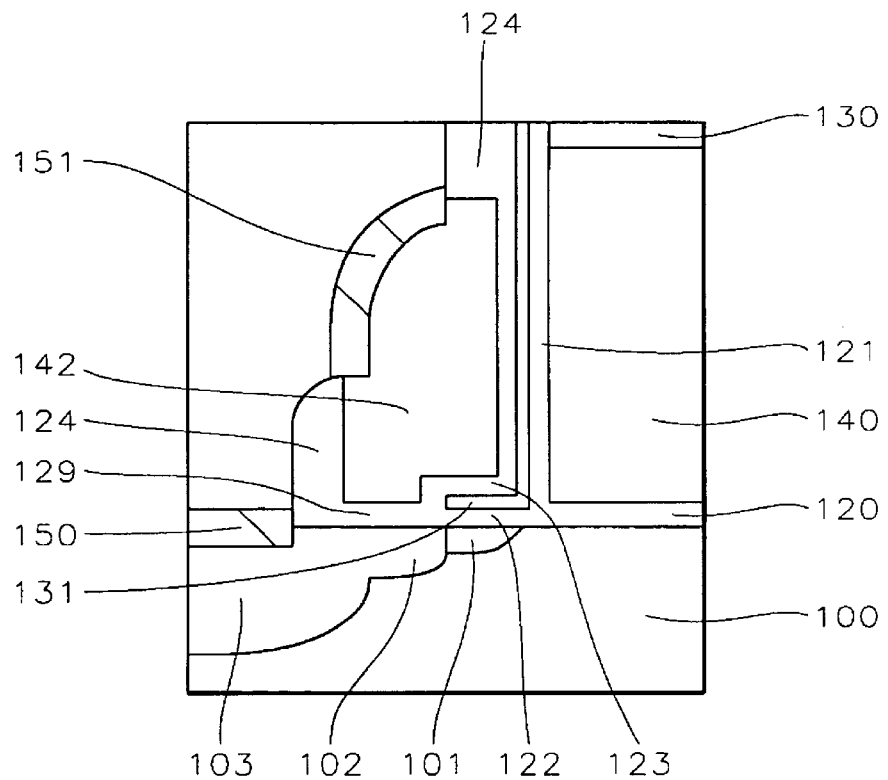
Figure 3C:
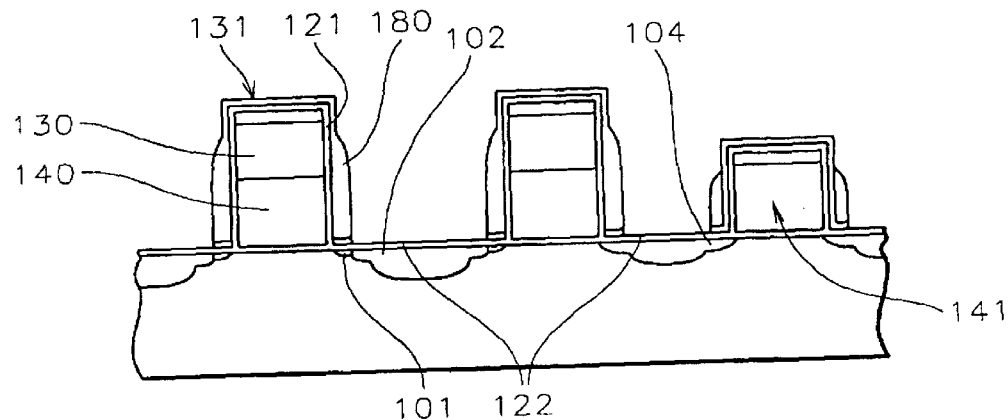
FIGS. 3C through 3E schematically illustrate in cross-sectional representation the alternative first preferred embodiment with DSW cut ONO of the present invention.
Figure 3D:
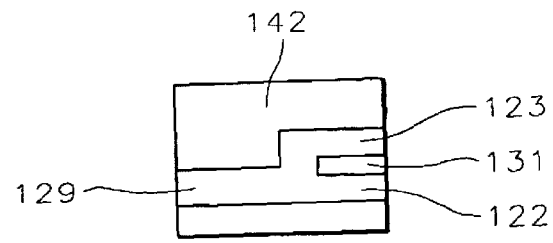
Figures 1, 6A:
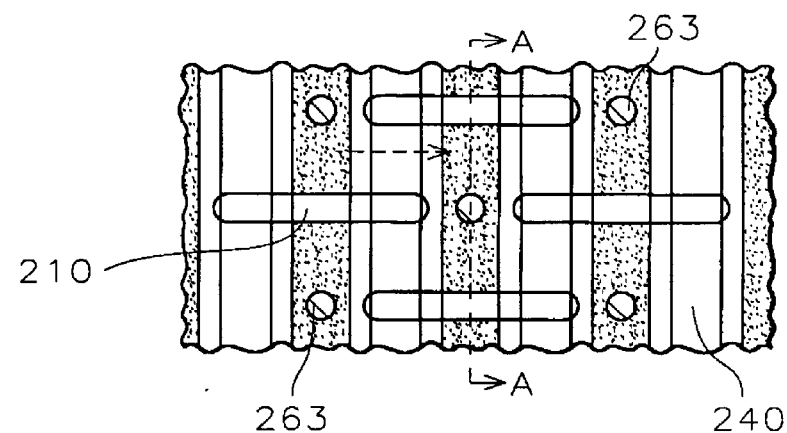
FIG. 6A-1 and FIG. 6A-2 schematically illustrate a top view of the second embodiment metal bit twin MONOS having a rectangular STI.
Figures 2, 6A:
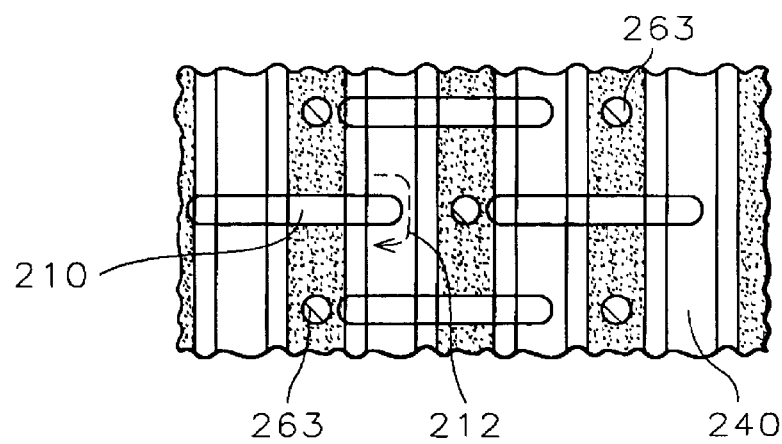
Figures 3, 6A:
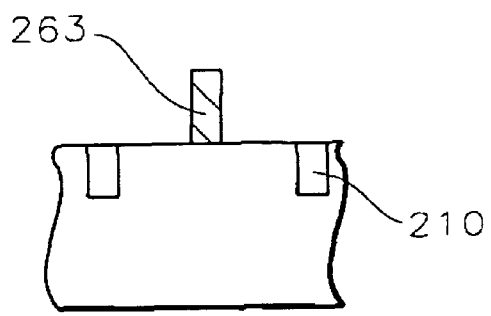

In an alternative in the first preferred embodiment process, shown in FIG. 3, the storage nitride layer 131 is cut at the Disposable Sidewall Spacer 180 instead of at the control polysilicon gate definition. The deviation starts after the oxide 120 is etched in FIG. 1F. The bottom oxide of ONO in the range of 2.0 nm to 6.0 nm is thermally grown using an ISSG tool. During the growth of oxide 122, for example, to 4.0 nm, the side wall oxide 121 of poly gate 140 is grown to about 5.5 nm by adjusting ISSG oxidation at 950° C., which is slightly thicker than bottom oxide 122. Then a uniform nitride layer of 7.5 nm (131) is deposited by CVD. Boron implant in the range of 1.2E13 to 2.5E13 atoms/cm$^2$ for control gate memory channel 101 can be inserted at just before the bottom oxidation 122 or immediately after the oxidation 122 or after the nitride 7.5 nm deposition. The implant energy is increased from 5 keV to 15 keV as the dielectric thickness over the channel 101 is increased. The disposable sidewall material such as plasma oxi-nitride, phosphorus doped polysilicon or BPSG, which can be selectively etched away without removing much nitride or thermal oxide, is conformally deposited in the range of 25 nm to 60 nm. Here the 50 nm is chosen as an example. The DSW film is anisotopically etched as in the previous embodiment (FIG. 1G). But this time (FIG. 3C), the nitride layer 131 under the DSW film 180 is etched away using etching gas such as $HBR/O_2/Cl_2$, which does not attack underneath oxide 122. The cross sectional structure at this point is illustrated in FIG. 3C. Using this DSW spacer 180 as an implant mask, As specie for N-LDD 102 is implanted vertically in the dosage range of 1E13 to 1E14 atoms/cm$^2$. Here the surface concentration of Boron at channel 101 is designed between 1E18 and 2E18 atoms/cm$^3$ at process end and meanwhile the surface concentration of N-LDD is between 5E18 and 1E19 atoms/cm$^3$. These profiles are chosen to create efficiently Channel Hot Electron during program but to minimize Hot Hole generation (or called Band to Band or Gate Induced Leakage) during erase. The DSW film 180 is selectively removed and most of the oxide 122 disappears after the cleaning process (preferable to leave an oxide layer by high selectivity during nitride etch). Then a thermal oxidation by ISSG at about 950° C. for 2 minutes is implemented to form a 4 to 6 nm oxide layer 123 over the nitride 131, and a 9–10 nm oxide layer 129 over N-LDD 102, as shown in FIG. 3D.

Figure 3E:
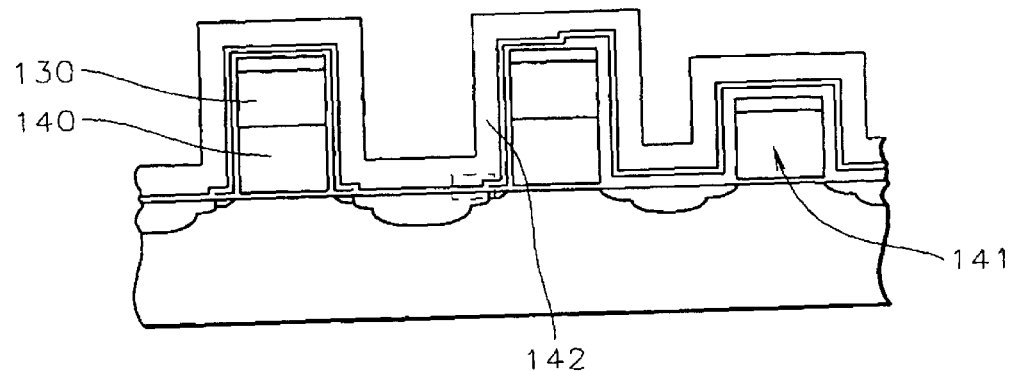

A memory control gate polysilicon 142 in FIG. 3E is deposited and the following process steps follow the previous embodiment. The device structure at the process end is provided in FIGS. 3A and 3B. Offsetting the storage nitride area from the N+ diffusion junction is the objective of this optional process. Since the source of GIDL current due to Band to Band tunneling requires about the concentration of 1E19 atoms/cm$^3$, the hole generation occurs at the edge of N-LDD and N+ junction where the concentration becomes about 1E19. If this generation point is covered with nitride and electrons are trapped in the nitride layer during programming, the hole generation current due to Band to Band tunneling is drastically enhanced (almost two orders) by the negative field created by the trapped electron. This behavior is the same observed in GIDL current increase with negative gate voltage increase in a conventional polysilicon gate MOSFET. Avoiding extra increase in hole current by CHE trap is very important to achieve large erase block size since the current supply capability from the charge pump is limited. This option, shown in FIGS. 3A and 3B, removes the nitride layer at the edges of the N-LDD and N+ junctions thereby preventing trapping of electrons in the nitride layer during programming.

The second embodiment of the present invention as shown FIGS. 2A through 2C will be described with reference to FIGS. 2D through 2R and FIGS. 6A through 6C. The first embodiment approach using diffusion as a bit line is a concern with IR drop due to diffusion resistance and its large RC delay, which should be minimized in high performance operation. In order to minimize IR drop due to diffusion resistance and its large RC delay, having a metal line contact each bit diffusion isolated by conventional STI rather avoiding a long diffusion line is invented in this second embodiment. In the second embodiment a word line runs parallel to a control gate and bit lines run across the word and control lines. Each memory cell is isolated by STI 210 as shown in top view in FIG. 6B-1. The memory control gate 242 is salicided, the memory word gate 240 and the logic gate are stacked metal gates such as tungsten/tungsten nitride/polysilicon, and the bit line is connected by a metal line. Self aligned contact to diffusion is also provided in this invention.

Figures 1, 6B:
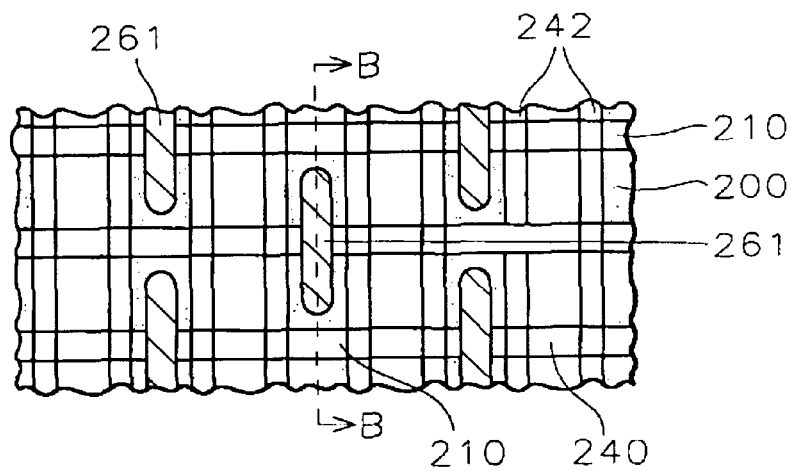
Figures 2, 6B:
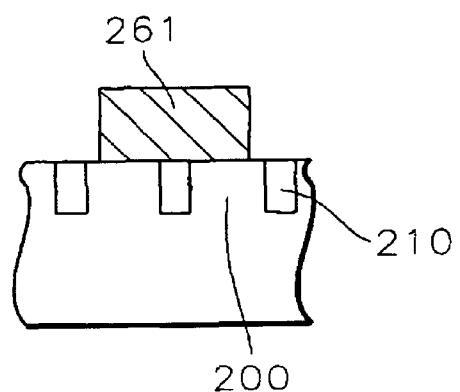

The isolated STI island in the memory area as shown in FIG. 6A is avoided by utilization of a long contact process connecting two adjacent diffusions across STI region as shown in FIG. 6B. The corner of the rectangular STI 210 on a mask is rounded through lithography process as shown in FIGS. 6A-1 and 6A-2. It may generate additional leakage concerned with overlay misalignment as shown by the leakage path 212 in FIG. 6A-2. In this invention, STI and active area are printed as line and space to avoid the leakage effect due to the corner rounding and overlay misalignment. Adjacent four memory bits are connected to each other by a rectangular shape contact instead of a common diffusion area and a square contact.

Figure 2A:
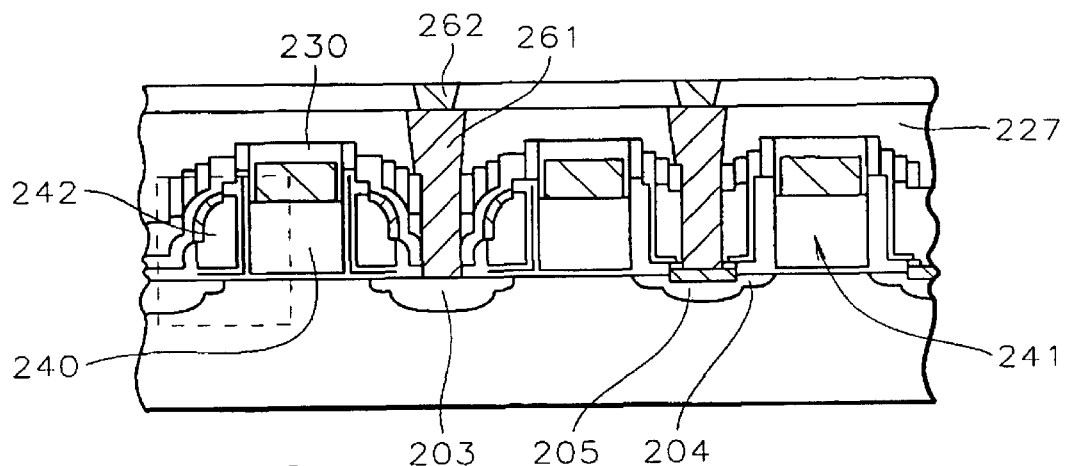
FIGS. 2A through 2C schematically illustrate in cross-sectional representation a completed twin MONOS device fabricated by a second preferred embodiment of the present invention.
Figure 2B:
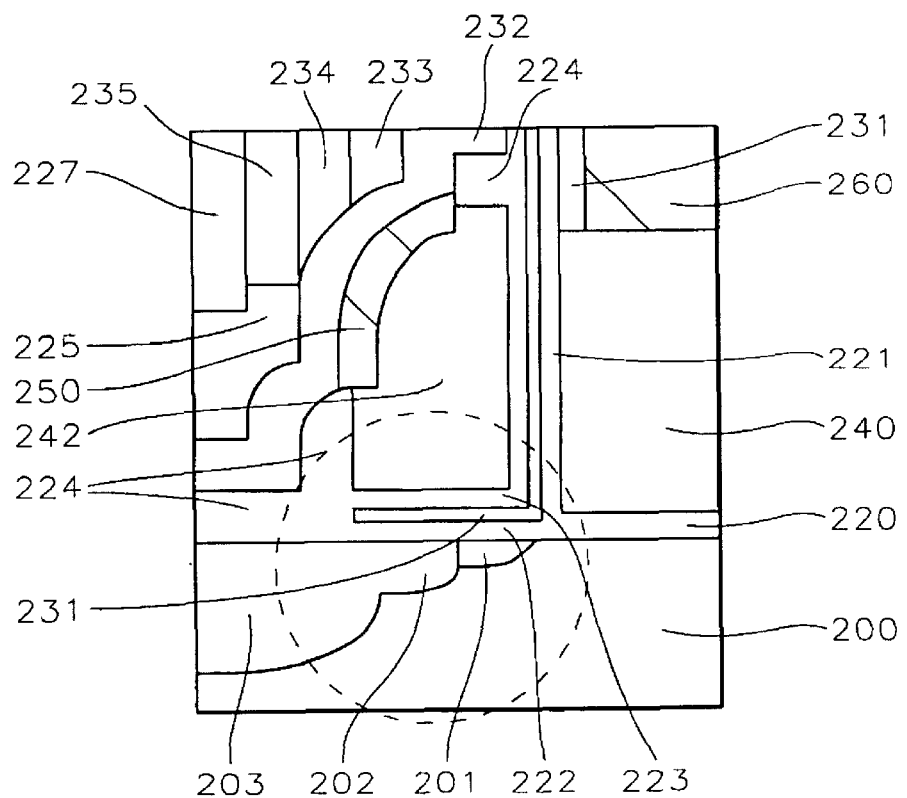
Figure 2C:
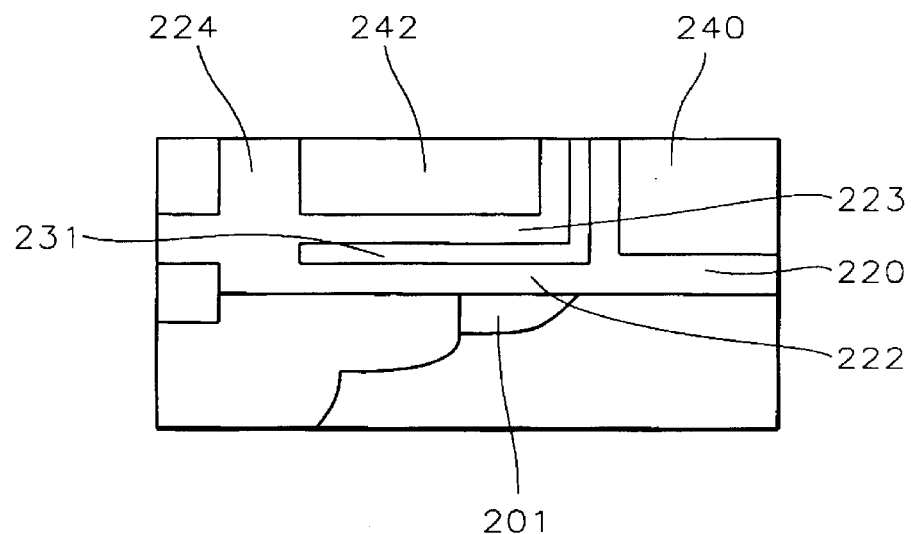
Figures 1, 6C:
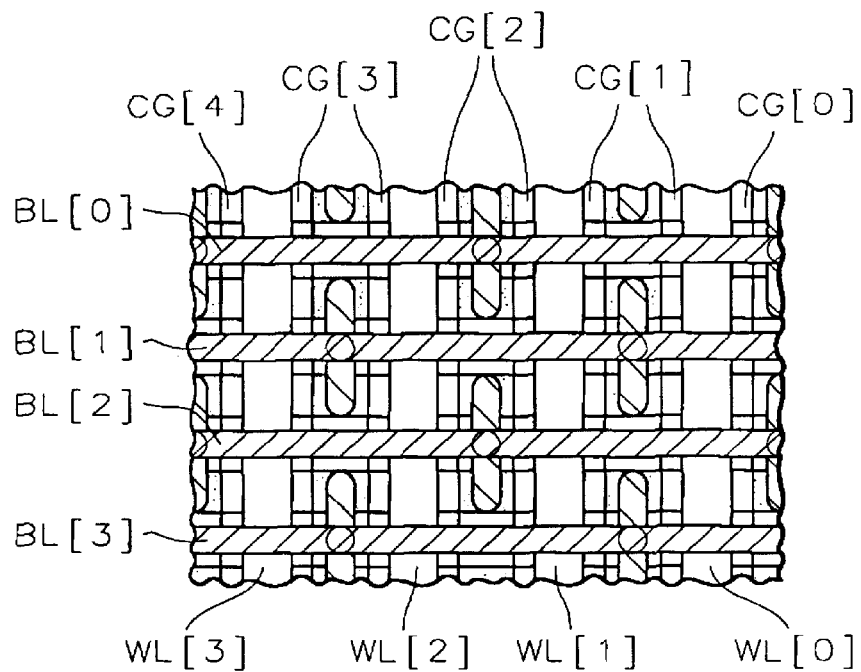
Figures 2, 6C:
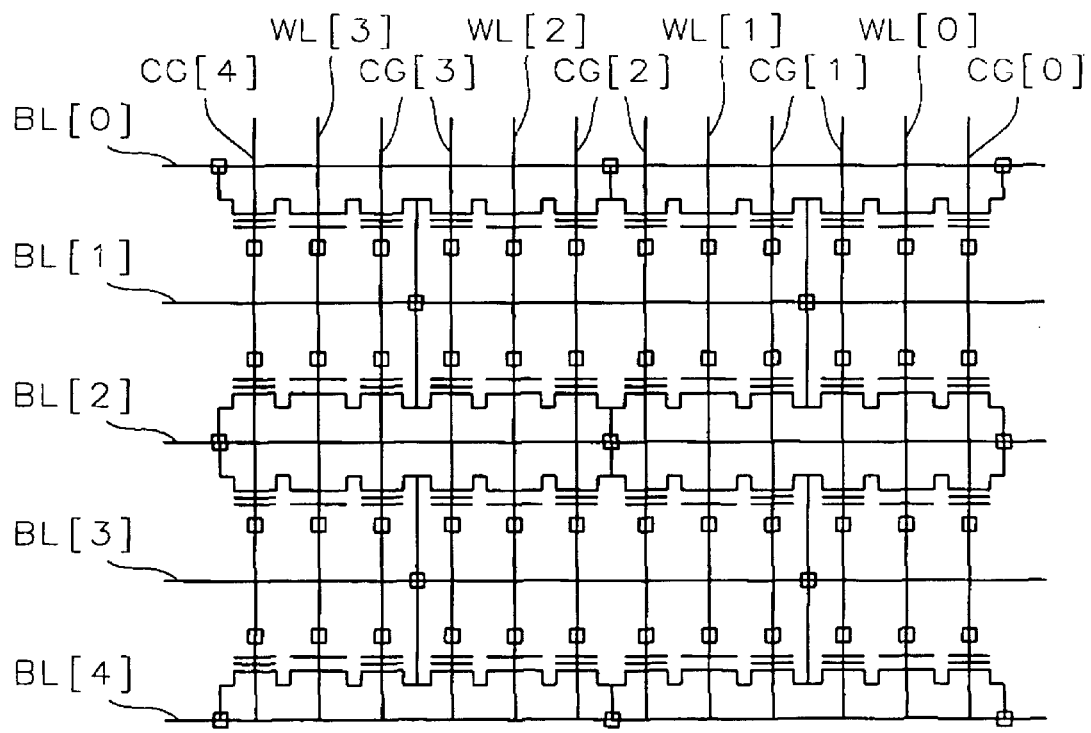

FIGS. 2A through 2C illustrate the MONOS device of the second embodiment Shallow trench isolation 210, shown in FIGS. 6A through 6C provide memory cell isolation and logic device isolation. A logic gate 241 and an adjacent salicided source/drain region 205 are formed in a logic area. A memory gate 240 and an adjacent source/drain region 203 in a memory area are formed. Control gates 242 are formed on sidewalls of the memory gate 240, isolated from the memory gate by an oxide-nitride-oxide (ONO) layer 222/231/223. A local wiring 261 through a dielectric level 227 contacts the source/drain region 203 in the memory area.

P-wells and N-wells are formed as is conventional in CMOS processing and will not be shown. As shown in FIGS. 2A through 2C, the word gate 240 of the twin MONOS memory and logic gate 241 in the peripheral and/or logic control circuit consisting of a composite layer of tungsten/tungsten nitride on polysilicon are simultaneously defined. Since the dielectric layer on a sidewall of the top W/WN layer must be of good quality, this part of W/WN is wrapped with nitride, as will be described subsequently.

Figure 2D:
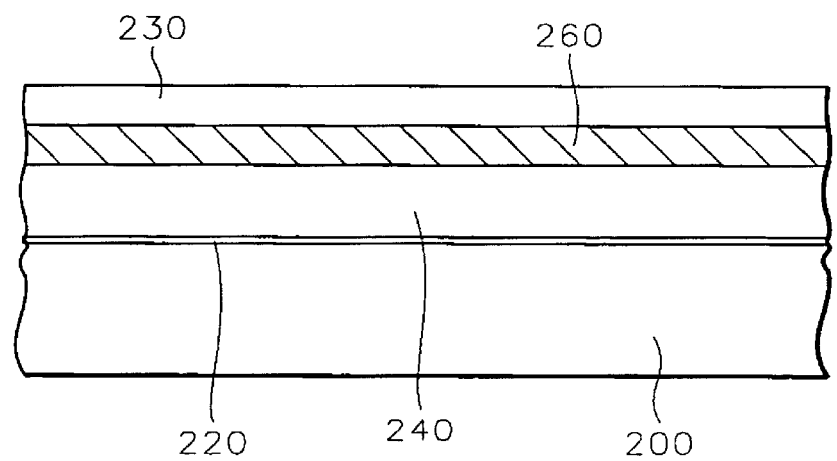
FIGS. 2D through 2H, 2J through 2N, and 2P through 2R schematically illustrate in cross-sectional representation a second preferred embodiment of the present invention.
Figure 2E:
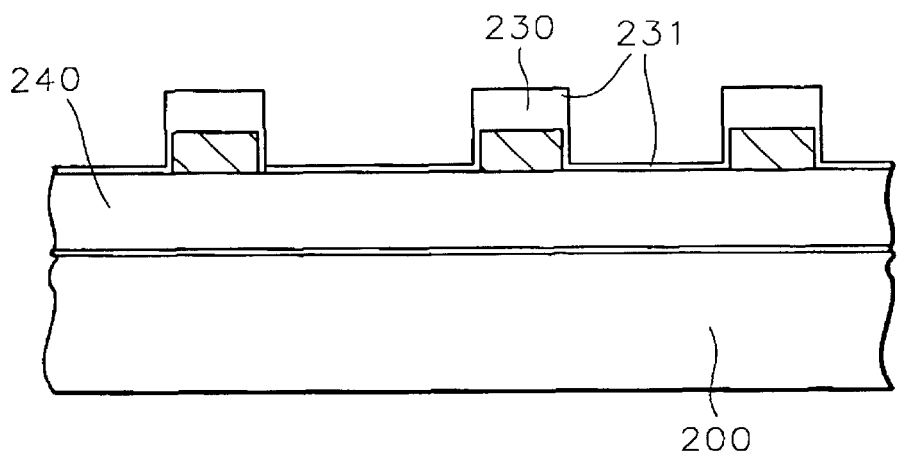
Figure 2F:
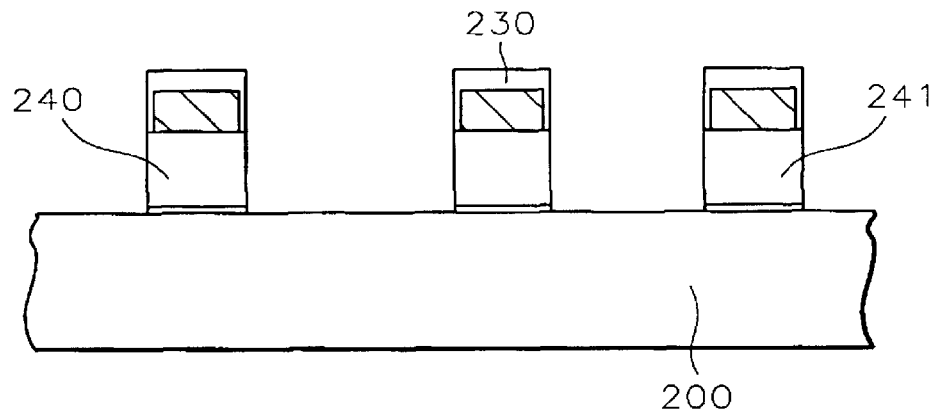

The memory gate silicon oxide and low voltage logic gate silicon oxide are formed to a thickness of between about 2 and 10 nm in FIG. 2D as 220. A gate silicon oxide thickness for a high voltage logic device is adjusted depending on the requirement of applied voltage. Then the polysilicon 240 in FIG. 2D is deposited in the range of about 150 to 250 nm by chemical vapor deposition (CVD) followed by W/WN 260 deposition by CVD and silicon nitride 230 deposition also by CVD. The photoresist image printed by a conventional lithography process is transferred into the cap nitride 230 and W/WN 260 by RIE, stopping at the polysilicon surface. Nitride 231 is deposited in the range of thickness of between 10 and 50 nm to wrap the side wall of W/WN 260 to protect W during oxidation, as shown in FIG. 2E. Then, a vertical reactive ion etch removes the thin nitride and polysilicon stopping at the gate oxide 220, as shown in FIG. 2F. The remaining oxide is gently etched away by a wet etch, for example.

Figure 2G:
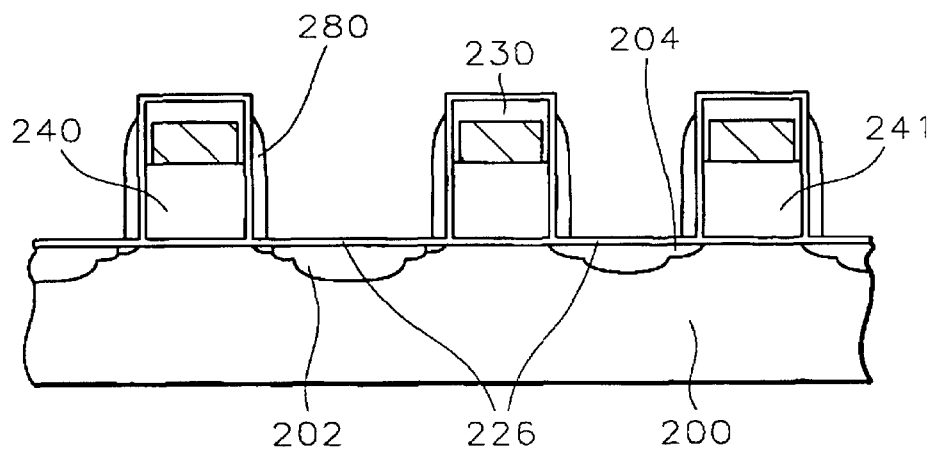
Figure 2H:
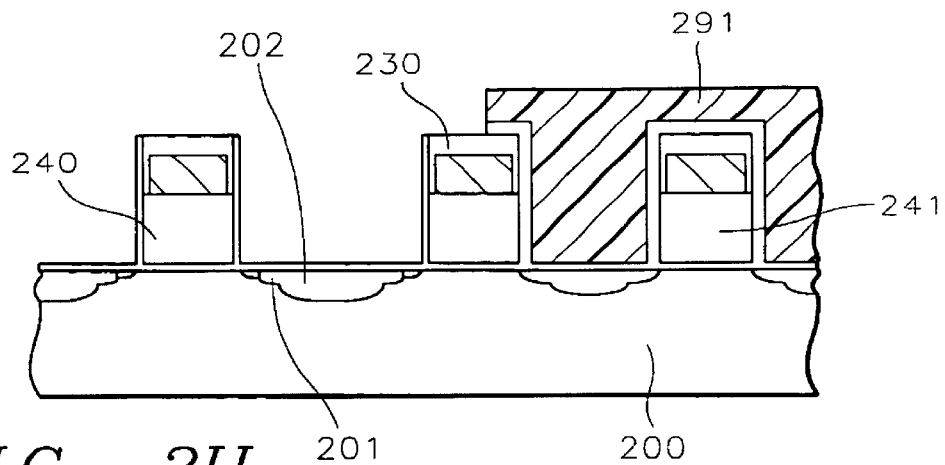

About 10 to 20 nm of silicon oxide 226 in FIG. 2G is deposited by CVD to be an offset for the Boron ion implantation 201 in FIG. 2H to adjust Vt under the control gate. The logic LDD structure 204 in FIG. 2G is formed by applying separate resist mask and ion implant prior to DSW material deposition. The disposable sidewall (DSW) spacer process is used to obtain the controllable ultra short channel length under the control gate for fast programming by high electron injection efficiency. A thin DSW layer 280 in FIG. 2G between about 30 and 50 nm such as a polysilicon, a silicon nitride or BPSG is deposited and followed by an anisotropic etch forming the disposable sidewall spacer on both sides of the memory word gate.

The logic area is covered with photoresist 291 in FIG. 2H to protect it from subsequent ion implantation. The etch proceeds in the memory area, where a photoresist boundary between memory and logic is taken on polysilicon at the edge of the memory area as shown in FIG. 2H. A fine mask alignment to the boundary is not necessary. Then an n-type dopant such as Arsenic is implanted into the LDD region 202 in FIG. 2G under the control gate masked by DSW, with arsenic as a dopant, acceleration energy 10 to 20 keV, dose between about 5E13 and 1E14 atoms/cm$^2$ as an example. After stripping the photoresist mask over the logic area with O$_2$ ashing, the DSW is removed by CDE or wet etch. Masking the logic area with photoresist again, p-type dopant is implanted with the offset of the remaining silicon oxide thickness on the word gate sidewall. For Vt adjusts under the control gate, implant specie BF$_2$, energy 30 keV and dose between about 1.2 to 3.5 E13 atoms/cm$^2$ form control gate channel region 201 in FIG. 2H.

The oxide 226 in the memory area is gently removed with wet or dry etch and the photoresist over the logic area is stripped away.

Figure 2J:
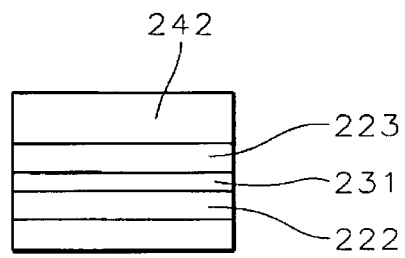

ISSG (in-situ steam generation) tool recently developed grows silicon dioxide on not only silicon but also silicon nitride. The growth rate is about 1 for single crystal silicon and 0.6 for silicon nitride. ISSG oxide quality is such that the oxide breakdown voltage is better than that of CVD oxide. A composite layer of oxide-nitride-oxide (ONO) 223-231-222 is formed with ISSG oxidation. The bottom oxide 222 in FIG. 2J is grown with ISSG to a thickness of between about 3.0 and 5.0 nm. ISSG reduces bird's beak under the edge of the memory word gate compared to conventional thermal oxide growth, regardless of doped species or concentration. ISSG grows the oxide on the cap nitride. The oxide grown with ISSG on nitride isolates the cap nitride and the nitride of the ONO composite layer. Pretreatment in NH$_3$ ambient, >850° C., provides a uniform nitride thickness of the composite layer. The silicon nitride layer 231 in FIG. 2J is deposited by chemical vapor deposition with a thickness of between about 6 and 9 nm. The oxide layer oxidized by ISSG oxidizes the nitride by between about 3 and 5 nm. The remaining nitride thickness of the composite layer is reduced to between about 3 and 6 nm after ISSG Oxidation.

Figure 2K:
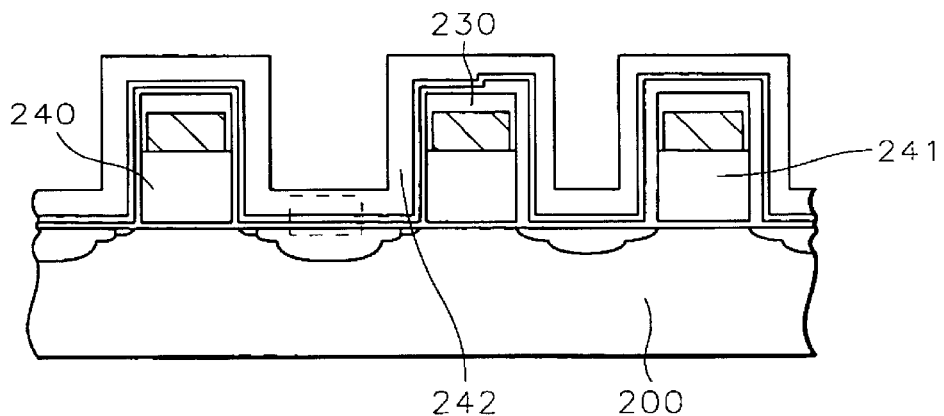

A memory control gate 242 in FIG. 2K is formed as a sidewall spacer of the memory word gate. The control gate of this second embodiment is easier than the first. The control gate etch doesn't have to go in deep because cap nitride as well as wrap nitride are never removed.

Figure 2L:
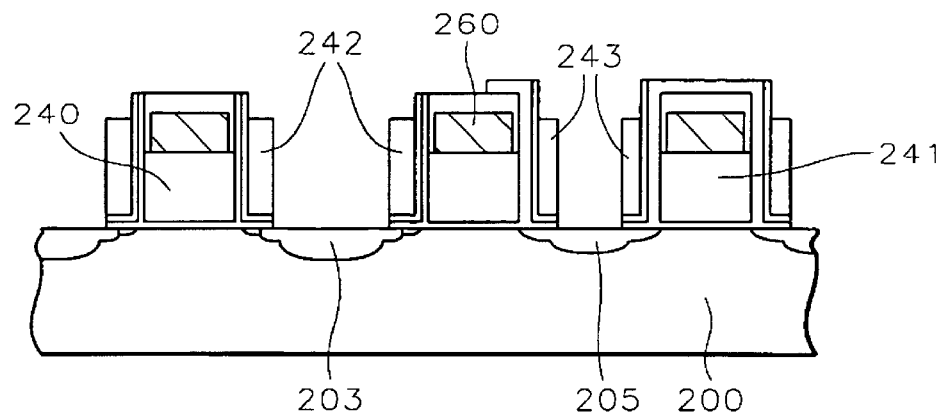

In FIG. 2K, an insitu phosphorus doped polysilicon 242 is deposited by CVD to a thickness of about 60 to 100 nm. The vertical reactive ion etch removes polysilicon until the ONO surface appears and about 10–30 nm of over etch is added to remove ONO top oxide and nitride and stop at the bottom oxide to leave the oxide over the logic source/drain region as shown in FIG. 2L. Then using a conventional CMOS process, the source/drain regions 205 in FIG. 2L of n-MOS and p-MOS are defined individually by n-type and p-type ion implantation. The polysilicon sidewall 243 in FIG. 2L is also used to form logic source/drain ion implantation.

Figure 2M:
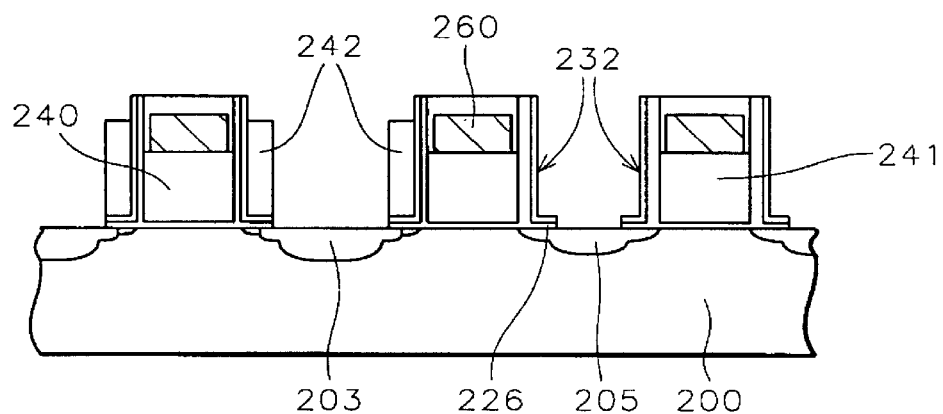

The polysilicon sidewalls in the logic area are removed by isotropic dry etch such as chemical down flow etch (CDE) or wet chemical etch where the memory area is masked by photoresist. The composite ONO layer under polysilicon sidewall remains after removing polysilicon. The photoresist masking the memory area is stripped by $O_2$ ashing. The remaining oxide over memory and logic source/drain regions 203 and 205 is etched away by light wet chemical etch or gentle dry etch. ONO Nitride 232 under polysilicon sidewall in the logic area as well as the oxide 226 under the nitride still remain as shown in FIG. 2M.

Figure 2N:
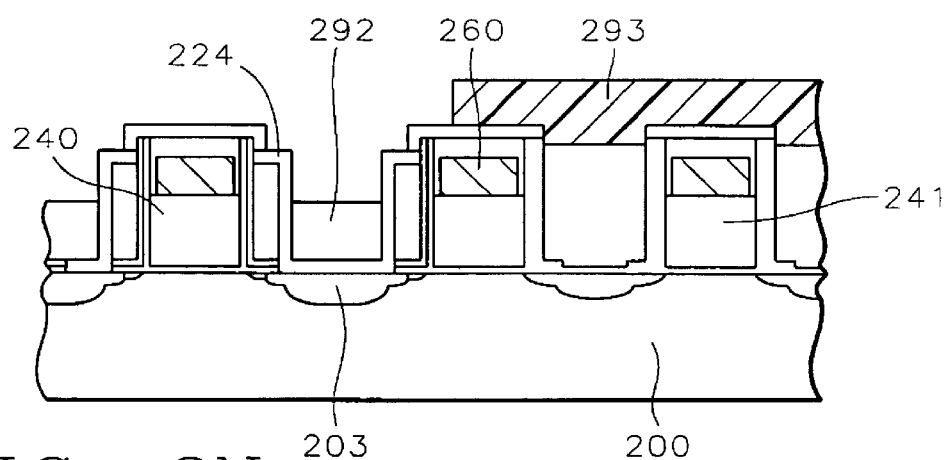

About 6 nm of recovery oxidation with ISSG is performed to recover a damaged ONO by RIE and to change the nitride 232 remaining on the surface completely into oxide. Another about 20 nm of oxide 224 in FIG. 2N is deposited to prevent implantation damages. Masking the logic area with photoresist, n-type memory dopant ions such as Arsenic are implanted in memory source/drain region 203 in FIG. 2M. The photoresist is stripped by $O_2$ ashing.

Salicidation to alloy silicon and metal such as Titanium, Cobalt etc. is required for the memory control gate and logic diffusion area to lower the resistance. The memory word gate and logic gate having metal (W/WN) don't need salicidation. Since the memory bit line uses metal wire, the bit line suicide is not necessary. To avoid the bit line salicidation, BARC 292 and photoresist 293 are coated as shown in FIG. 2N, exposed and developed. BARC is removed until the control gate is exposed. After resist and BARC strip with $O_2$ ashing, the memory control gate and logic diffusion are exposed for salicidation, as shown in FIG. 2N.

Figure 2P:
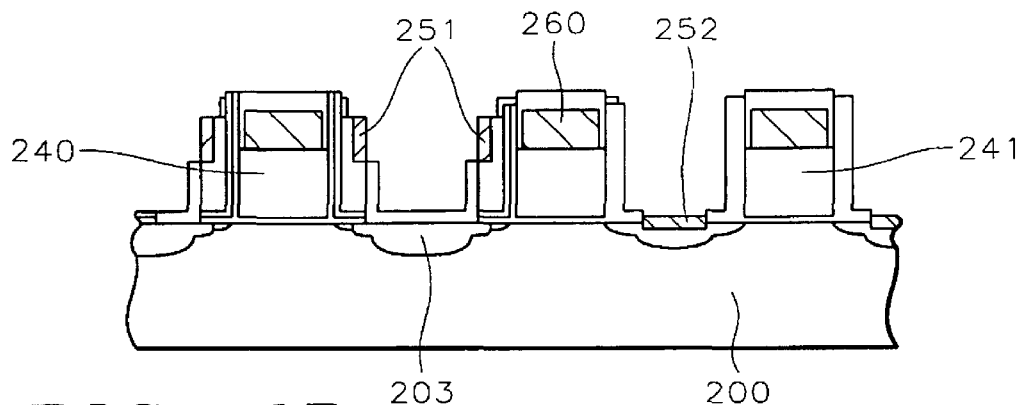

A salicidation metal such as cobalt, titanium etc is subsequently deposited by sputtering followed by salicide formation anneal. The formation anneal promotes the metal to react with the silicon turning into a metal-silicon alloy. The unreacted metal is stripped with an appropriate chemical such as $H_2O_2$/sulphuric acid. The salicide is not stable enough just after the formation anneal, so another anneal called a conversion anneal is performed to stabilize the salicide at a higher temperature. The control gate 251, and the logic diffusion 253 are now all salicided, as shown in FIG. 2P.

Figure 2Q:
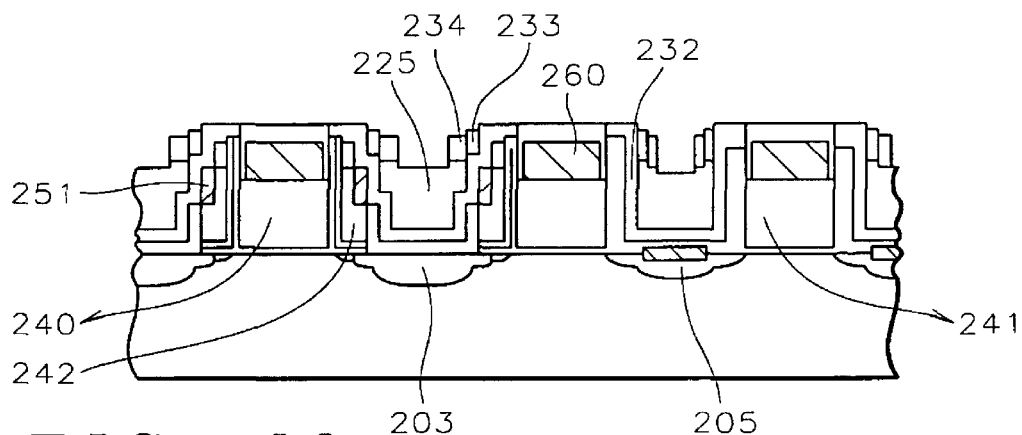

In a normal approach to make contact to diffusion area 203, the diffusion area between two adjacent word gates 240 is opened wide enough to consider misalignment between gate and contact masks. For a self-aligned contact, a thicker nitride 232 than the control gate thickness is deposited as shown in FIG. 2Q. A thick oxide 225 is deposited by CVD to a thickness of about 500 nm and planarized by CMP (chemical mechanical polish). Long contact 261 is used to connect adjacent active areas as shown in top view in FIG. 6B-1 and in cross-section in FIG. 6B-2. Then oxide is deposited by CVD. Self-aligned contact reduces chip size drastically.

Figure 2R:
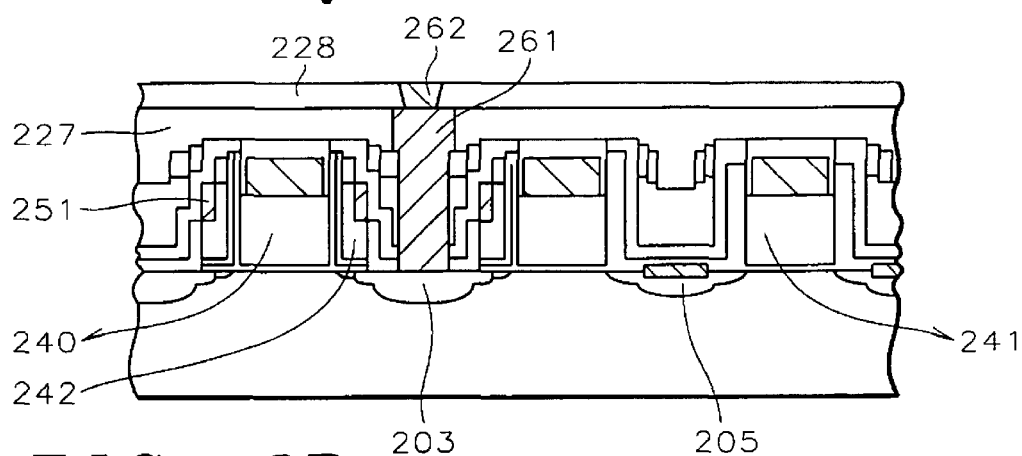

As shown in FIG. 2R, after the wide contact hole 261 is opened through oxide 227, the nitride layer 232 is etched prior to filling the W stud. The nitride layer on the control gate shoulder 232 may be thinned by the vertical contact etch and it may cause a short between the control gate and the bit contact W stud. In order to avoid the potential short, the following approach is proposed and illustrated in FIG. 2Q. After depositing the nitride layer 232, a material such as BPSG, which becomes an etch stop and is easily removed by a light HF wet etch without attacking the nitride layer, is deposited to fill the gap in the thickness of about 400 nm. Then the BPSG is planarized by etch back or CMP, and the BPSG is recessed to the top shoulder of control gate polysilicon 242.

A thin nitride layer around 10 to 30 nm is deposited and a vertical nitride etch is performed to form the thin nitride spacer. This deposit and etch of nitride layer is repeated until the shoulder is completely covered with the extra nitride spacer 233, 234. Hereafter the normal metal wiring process will be followed. Thus, the shoulder short concern can be avoided by this unique self-aligned contact process.

FIG. 4 illustrates an alternative in the second embodiment, similar to the first embodiment alternative wherein the storage nitride is cut by DSW in order to reduce erase current and to improve reliability. For example, for a bottom oxide of 4.0 nm, after FIG. 2F, during the growth of oxide 222, shown in FIG. 4C, the side wall oxide 221 of poly gate 240 is grown about 5.5 nm by adjusting ISSG oxidation at 950° C., which is slightly thicker than bottom oxide 222. Then a uniform nitride layer of 7.5 nm 231, shown in FIG. 4D, is deposited by CVD. A Boron implant in the range of 1.2E13 to 2.5E13 atoms/cm$^2$ for control gate memory channel 201 can be inserted just before the bottom oxidation 222 or immediately after the oxidation 222 or after the nitride 7.5 nm deposition. The implant energy is increased from 5 keV to 15 keV as the dielectric thickness over the channel 201 is increased. The disposable sidewall material such as plasma oxi-nitride, phosphorus doped polysilicon or BPSG, which can be selectively etched away without removing much nitride or thermal oxide, is conformally deposited in the range of 25 nm to 60 nm. Here 50 nm is chosen as an example. The DSW film is anisotopically etched as in the previous embodiment (FIG. 2G). But this time (FIG. 4C), the nitride layer 231 under the DSW film 280 is etched away using etching gas such as HBr/$O_2$/$Cl_2$, which does not attack underneath oxide 222. The cross sectional structure at this point is illustrated in FIG. 4C. Using this DSW spacer 280 as an implant mask, As specie for N-LDD 202 is implanted vertically in the dosage range of 1E13 to 1E14 atoms/cm$^2$. Here the surface concentration of Boron at channel 201 is designed between 1E18 and 2E18 atoms/cm$^3$ at process end and meanwhile the surface concentration of N-LDD is between 5E18 and 1E19 atoms/cm$^3$. These profiles are chosen to create efficiently Channel Hot Electron during program but to minimize Hot Hole generation (or called Band to Band or Gate Induced Leakage) during erase. Once the DSW film 180 is selectively removed, most of the oxide 222 disappears after the cleaning process (it is preferable to leave an oxide layer by high selectivity during nitride etch). Then a thermal oxidation by ISSG at about 950° C. for 2 minutes is implemented. A 4 to 6 nm oxide layer 223 over the nitride 231, and a 9-10 nm oxide layer 229 over N-LDD 202 are grown in FIG. 4D.

Figure 4A:
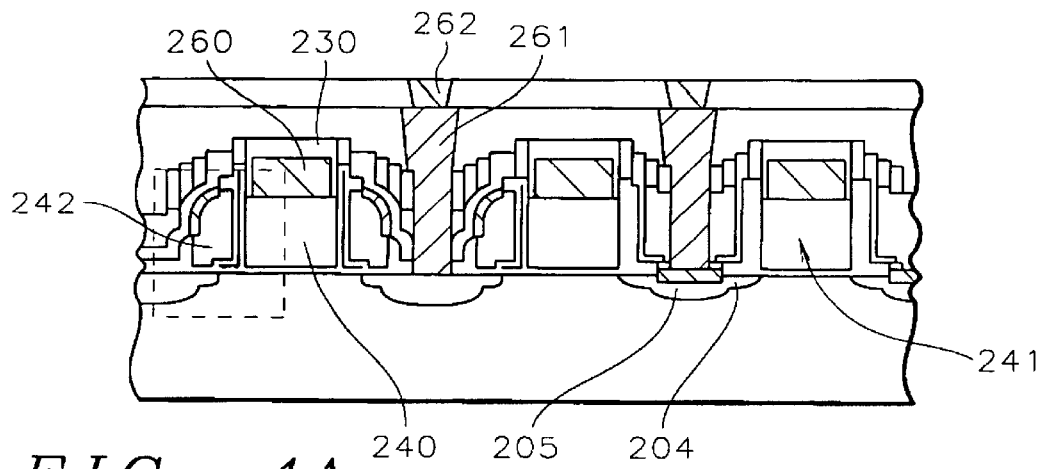
FIGS. 4A and 4B schematically illustrate in cross-sectional representation a completed twin MONOS device with the ONO defined by DSW and offset by N region to N+ region as an alternative second preferred embodiment of the present invention.
Figure 4B:
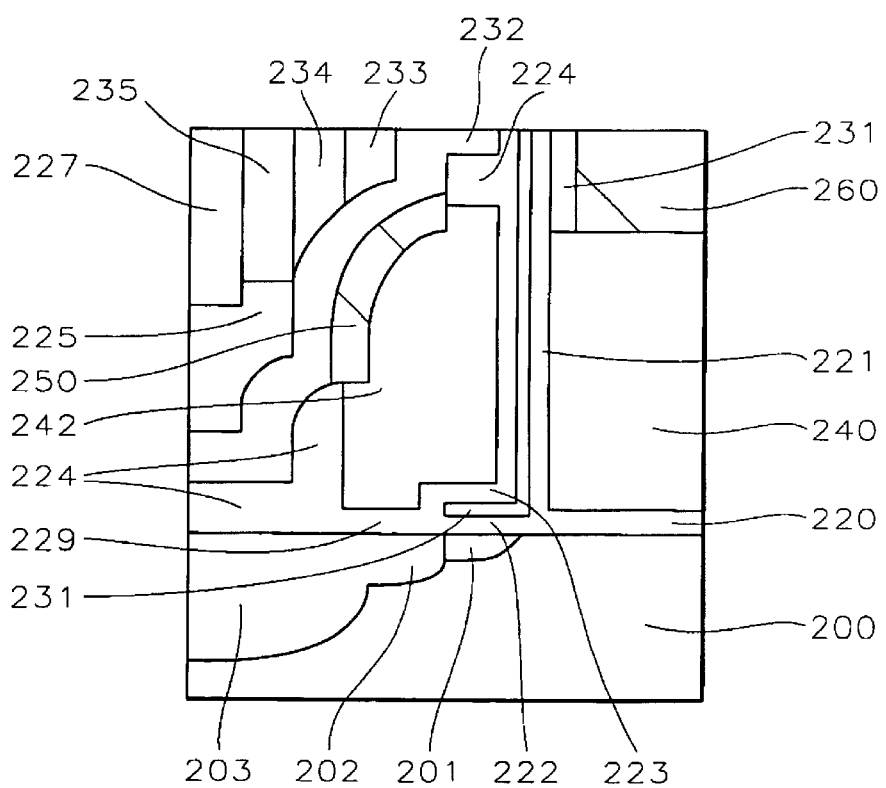
Figure 4C:
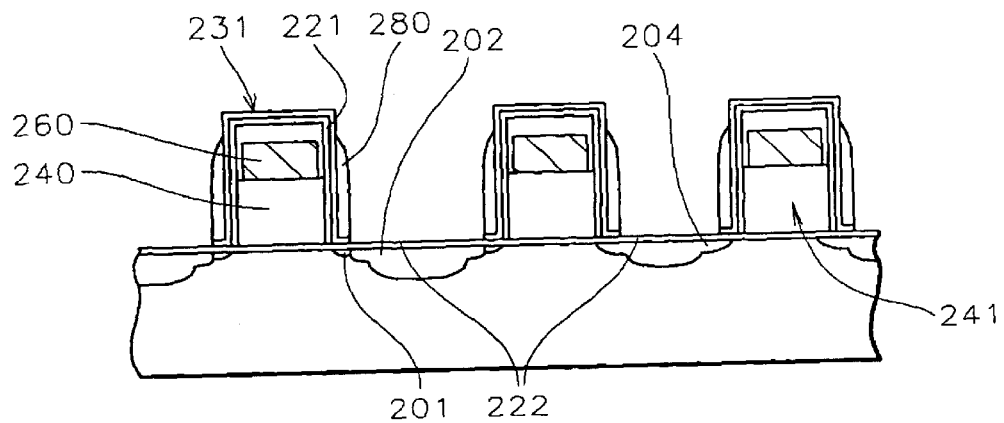
FIGS. 4C through 4E schematically illustrate in cross-sectional representation the alternative second preferred embodiment of the present invention.
Figure 4D:
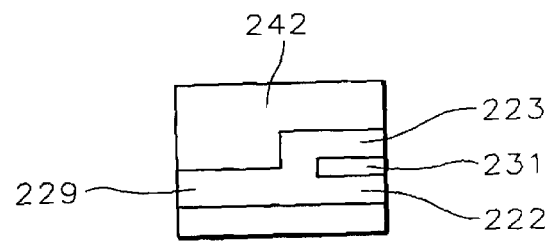
Figure 4E:
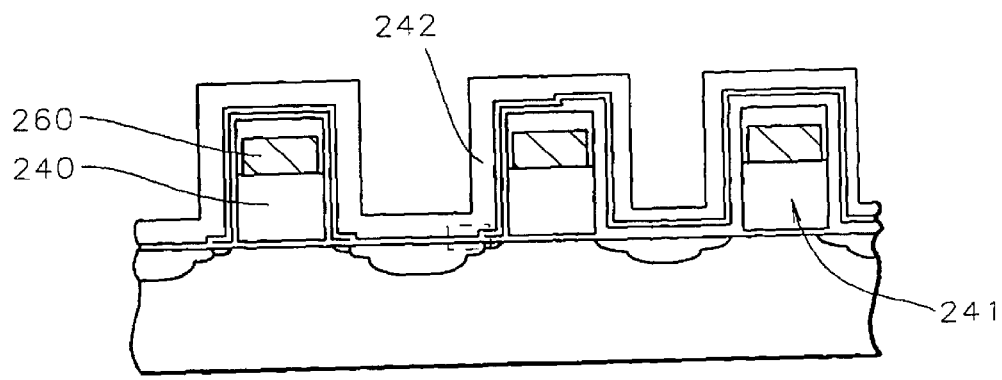

A memory control gate polysilicon 242 in FIG. 4E is deposited and the following process steps follow the second embodiment description above. The device structure at the process end is provided in FIGS. 4A and 4B. Offsetting the storage nitride area from the N+ diffusion junction is the objective of this optional process. Since the source of GIDL current due to Band to Band tunneling requires about the concentration of 1E19 atoms/cm$^3$, the hole generation occurs at the edge of N-LDD and N+ junction where the concentration become about 1E19. If this generation point is covered with nitride and electrons are trapped in the nitride layer during programming, the hole generation current due to Band to Band tunneling is drastically enhanced (almost two orders) by the negative field created by the trapped electron. This behavior is the same observed in GIDL current increase with negative gate voltage increase in a conventional polysilicon gate MOSFET. Avoiding extra increase in hole current by CHE trap is very important to achieve large erase block size since the current supply capability from charge pump is limited. This is achieved by the optional alternative just described.

The process of the present invention provides a method to integrate fabrication of twin MONOS memory cell arrays and CMOS logic circuits. Memory gates and logic gates are defined simultaneously thereby improving the integration process scheme for easier and more reliable fabrication. Furthermore, parasitic sheet resistance is lowered to enable high speed while maintaining low manufacturing cost. This is achieved by a metal contact on bit diffusions in which the metal bit line is perpendicular to the word gate and control gate which are parallel to each other as shown FIG. 6C.

Thus the memory cell arrangement (cell architecture) for this metal contact on bit diffusion approach in the second embodiment is different from diffusion bit line approach without contact in the first embodiment. Equivalent circuit diagrams are provided in FIG. 5F for bit diffusion approach (corresponding to top view in FIG. 5E) and in FIG. 6C-2 for metal contact approach (corresponding to top view in FIG. 6C-1).

The third embodiment of the present invention, as shown in through FIG. 7B to FIG. 7F, is of twin MONOS array architecture. The embodiment is regarded as a derivative of the second embodiment. The bit line crosses word line and control gate but differs from the second embodiment in that bit lines are not shared by adjacent rows. Dual bit lines along a row, featured with metal, control the diffusion voltage on both sides of the word gate independent from other dual bit line rows. The fabrication method described in the second embodiment can be exactly copied to achieve the third embodiment so that it will not appear here.

Figure 7A:
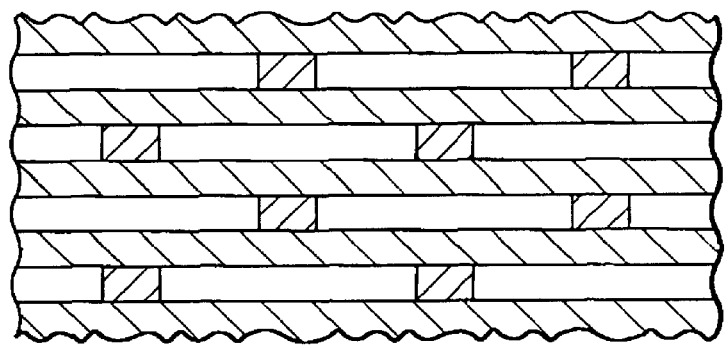
FIGS. 7A through 7E schematically illustrate top views of the third embodiment; dual metal bit twin MONOS.
Figure 7B:
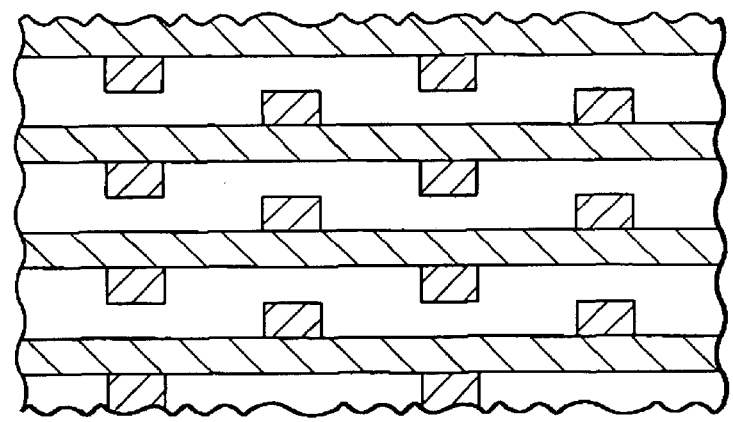

Cells in adjacent rows separated by STI as shown in FIG. 7B do not share the bit line to operate the individual cells independently, unlike the second embodiment. The STI mask is designated to apply operation voltages individually on both side diffusions of a word gate. The STI mask as illustrated in FIG. 7B is generated by removing every other active line from the rectangular STI mask of the second embodiment as shown in FIG. 7A. Diffusion contacts are placed by extending the diffusion area alternately on each side of an active line as shown in FIG. 7B.

Figure 7C:
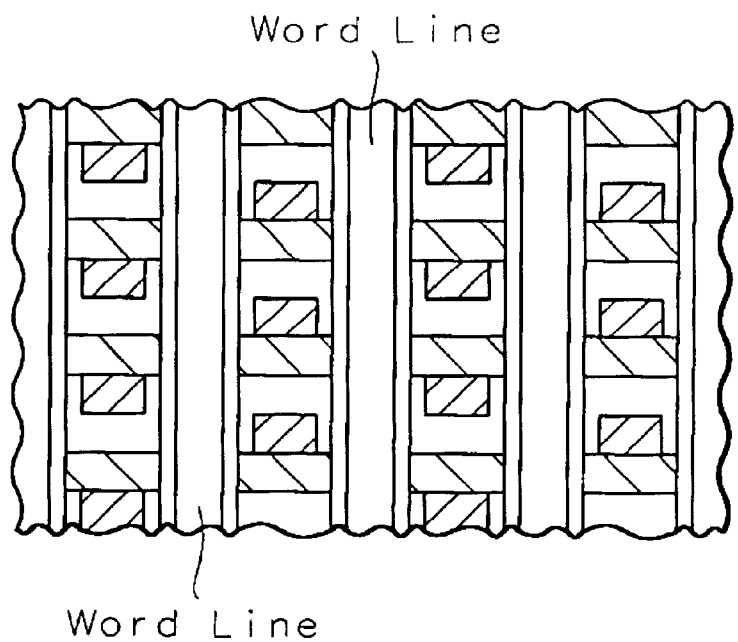
Figure 7D:
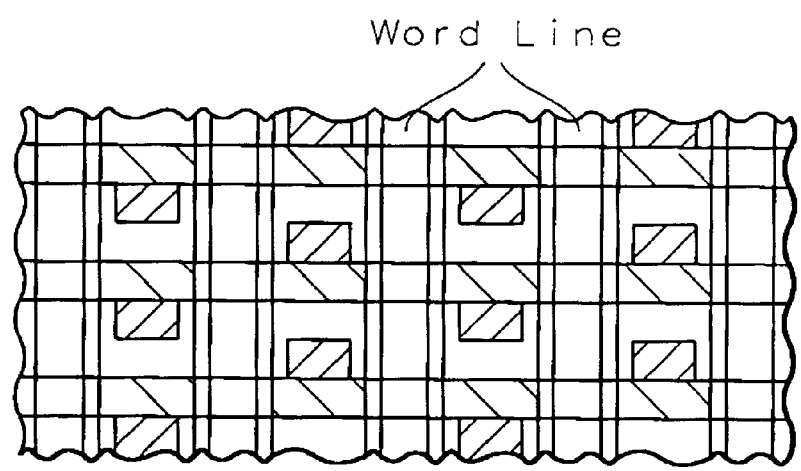
Figure 7E:
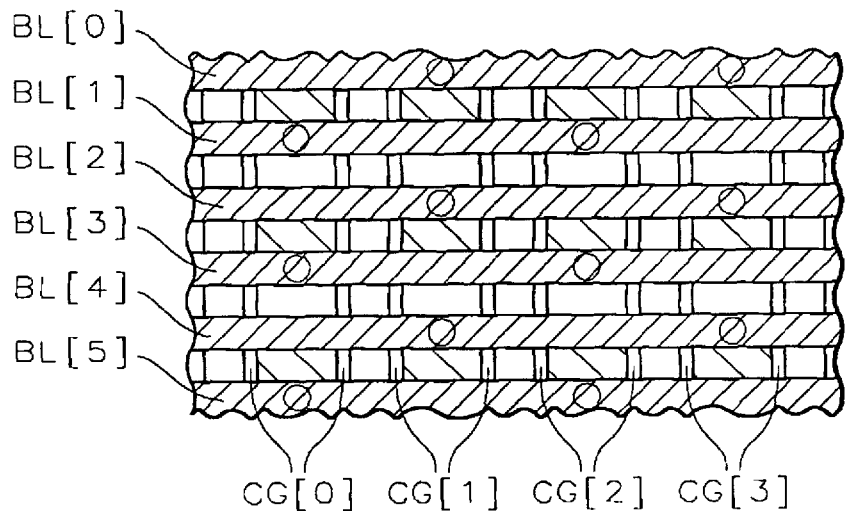
Figure 7F:
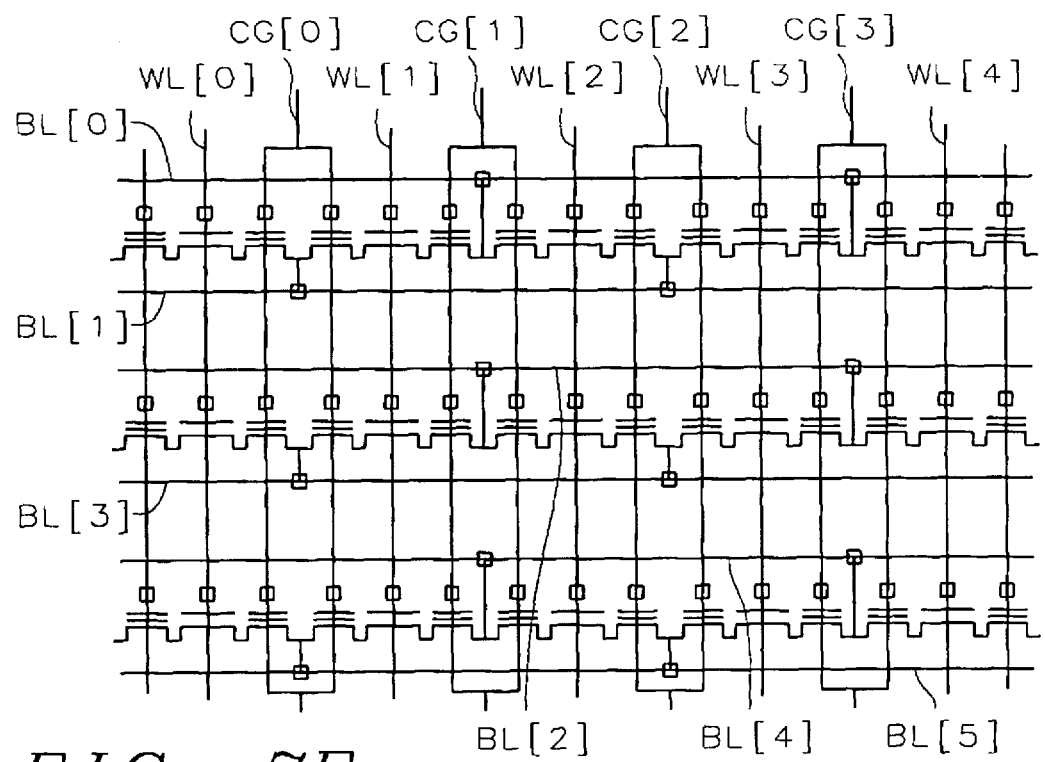
FIG. 7F schematically illustrates an electrical circuit diagram of the third embodiment dual metal bit twin MONOS.

Word lines are arranged as crossing the active line and STI (Shallow Trench Isolation) as shown in FIG. 7C and FIG. 7D. The memory diffusion between the word gates coming out after the gate process is extended alternately along the bit line direction as shown in FIG. 7D. The diffusion extensions on one side of a row contact one of the dual metal bit line and on the other side contact the other as shown in FIG. 7E, in order to apply an operation voltage individually on a diffusion bit on each side of the word gate. The electrical equivalent circuit diagram to the top view structure in FIG. 7E is shown in FIG. 7F to help understanding.

The fourth embodiment of the present invention, as shown in FIG. 8A to FIG. 8F, is also of twin MONOS array architecture. The architecture combines the concepts in the second embodiment and the first embodiment based on the U.S. Pat. No. 6,255,166. Diffusion on one side of a word line is separated into individual bits by STI and on the other side is continued as a line to enable NOR operation keeping a feasibility of high-density application.

Figures 1, 8A:
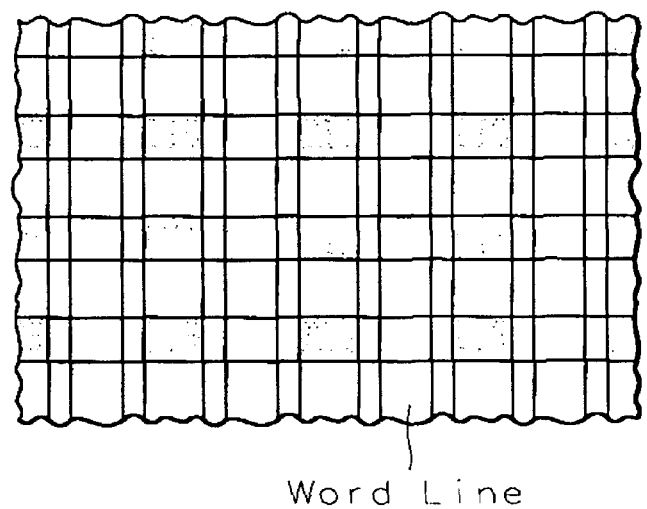
FIG. 8A through FIG. 8D schematically illustrate top views of the fourth embodiment; metal bit/diffusion source twin MONOS.
Figures 2, 8A:
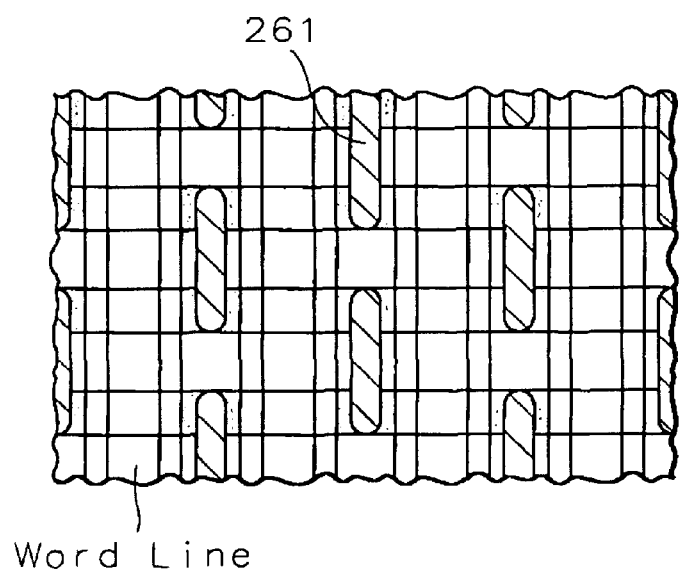
Figures 3, 8A:
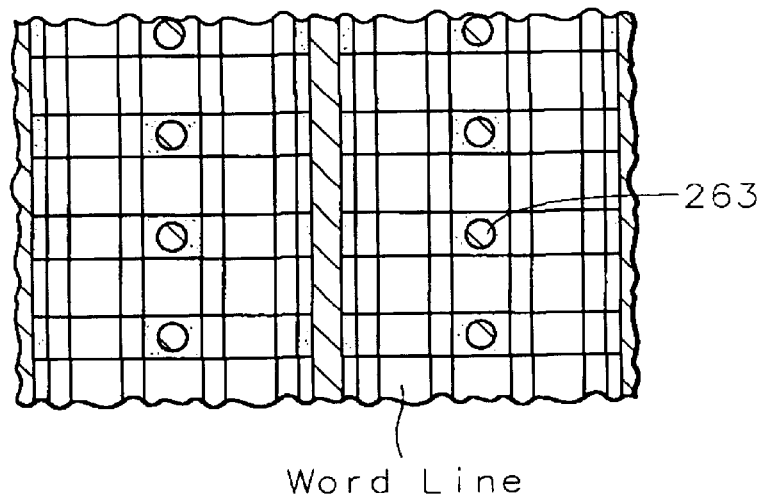
Figures 1, 8B:
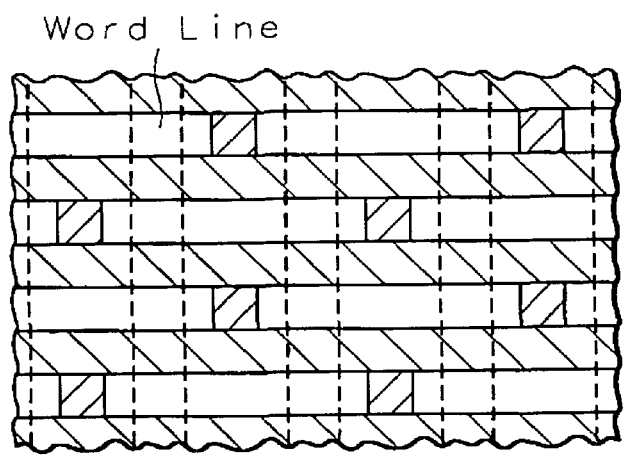
Figures 2, 8B:
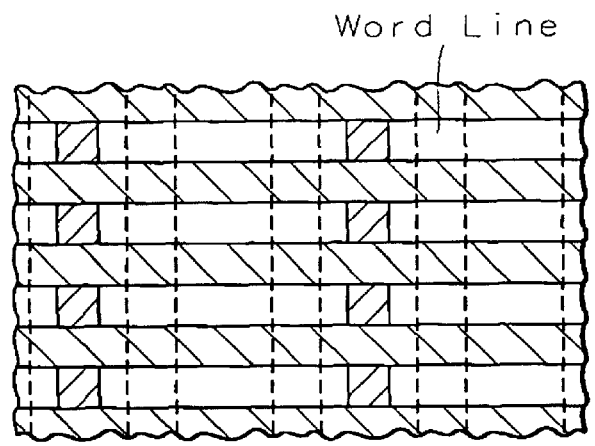

The fabrication method described in the second embodiment is also applicable to the fourth embodiment by converting the long contact process (FIG. 8A-1) to a Tungsten plugged line process as shown in FIG. 8A-2. The process flow through to contact oxide CMP as shown in FIG. 8A-1 is common between the Tungsten plugged line process and the long contact process. The structure of the fourth embodiment as shown in FIG. 8A-3 is delivered by replacing the long contact mask in FIG. 8A-2 by a Tungsten plugged line mask in FIG. 8A-3, where a tungsten stud and a bit line contact are combined. It is followed by the fabrication method described in the second embodiment sequenced as the Titanium-nitride/tungsten deposition, Tungsten CMP, Oxide deposition, bit contact open and conventional metal wiring process to form a metal bit line as in FIG. 8D. Each diffusion segment on one side of the word line is isolated by STI (Shallow trench isolation) and contacts a metal bit line. The segments on the other side of the word line are connected to each other via a tungsten-plugged line to act as a source line. Schematic electrical circuit diagram FIG. 8E is equivalent to FIG. 8D and allows random read/write operation. Since the embodiment doesn't need dual metal line, it is more preferred for high density application than the third embodiment. The circuit is also achievable with modifying the STI mask in the second embodiment. The rectangular STIs are periodically placed on a line along the bit line direction in the both embodiments as shown in FIG. 8B-1 and FIG. 8B-2. While the STI row and half pitch offset rows appear alternately along the word line direction in the second embodiment as shown in FIG. 8B-1, they are aligned along the direction in the fourth embodiment as shown in FIG. 8B-2. The continued diffusion appears on one side of the word line and the diffusion bits are isolated by STI on the other side as shown in FIG. 8B-2. The layout is equivalent to the electrical circuit FIG. 8E. FIG. 8A is preferred compared to FIG. 8B because of process window about the corner rounding and overlay as described in the second embodiment.

Figure 8C:
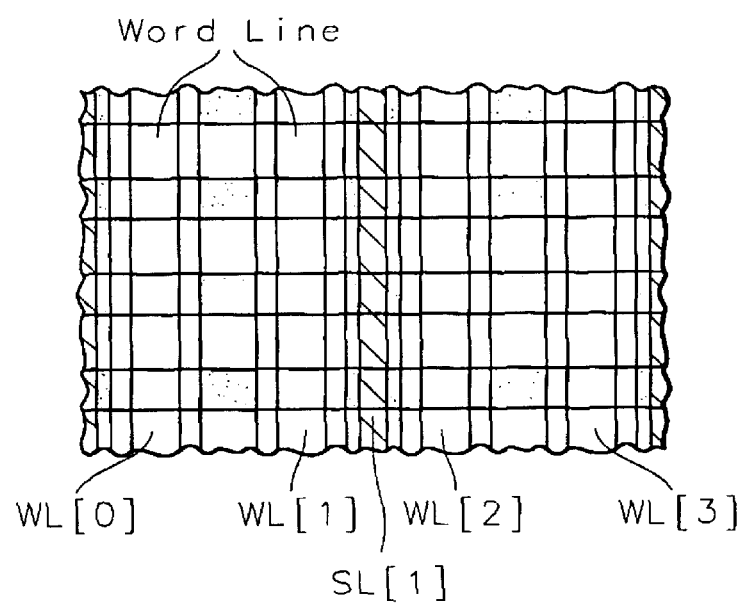
Figure 8D:
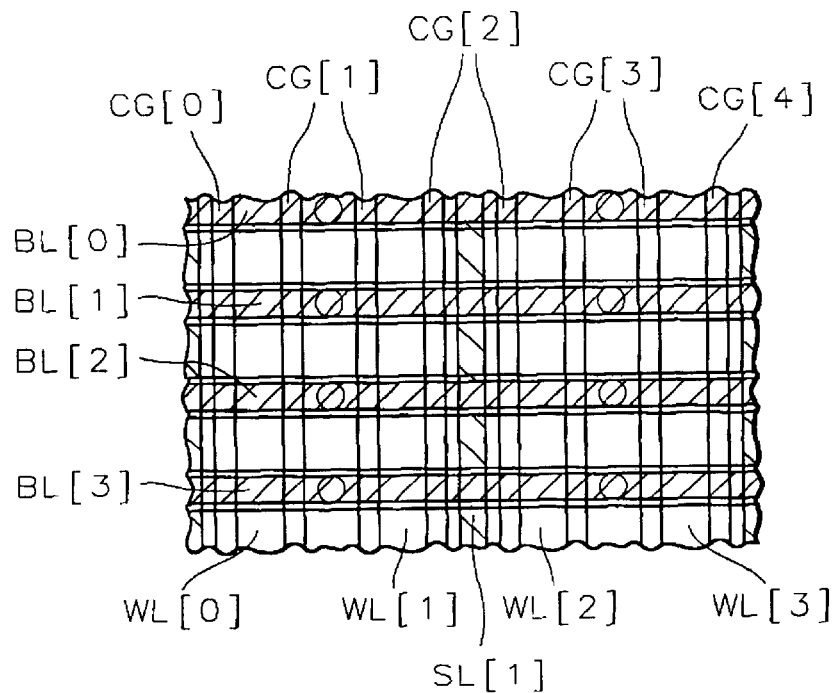
Figure 8E:
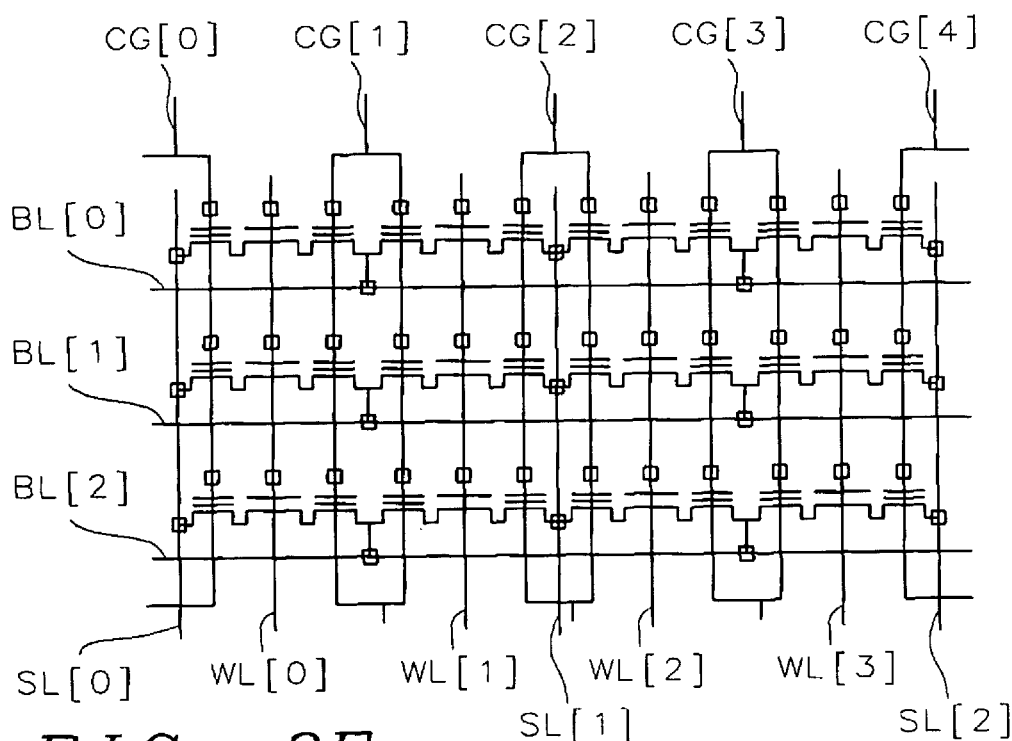
FIG. 8E schematically illustrates an electrical circuit diagram of the fourth embodiment; metal bit/diffusion source twin MONOS.

FIG. 8C illustrates a top view of the fourth embodiment after gate process and FIG. 8D does that after $1^{st}$ metal process. FIG. 8E is an equivalent electrical circuit diagram corresponding to FIG. 8D to help understanding.

While this invention has been particularly shown and described with reference to the preferred embodiments thereof, it will be understood by those skilled in the art that various changes in form and details may be made without departing from the spirit and scope of the invention.

The invention claimed is:

1. A twin MONOS memory cell array and CMOS logic device circuit integrated circuit device comprising:
   a field implant memory cell isolation in a memory area;
   a salicided logic gate and an adjacent salicided source/drain region in a logic area;
   a memory gate and an adjacent salicided source/drain region in said memory area;
   control gates on sidewalls of said memory gate isolated from said memory gate by an oxide-nitride-oxide (ONO) layer; and a salicided word gate contacting said memory gate.

2. The device according to claim 1 wherein said control gates are parallel to a bit line and wherein said word line is perpendicular to said control gates and to said bit line.

3. The device according to claim 1 wherein said memory gate and said logic gate comprise polysilicon.

4. The device according to claim 1 wherein said word line is selected from the group containing polysilicon, tungsten/polysilicon, and tungsten silicide/polysilicon.

5. The device according to claim 1 wherein said ONO layer also underlies said control gates.

6. The device according to claim 1 wherein said ONO layer does not underlie the portion of said control gates adjacent to said source/drain region.

7. A twin MONOS memory cell array and CMOS logic device circuit integrated circuit device comprising:

a shallow trench isolation for memory cell isolation and logic device isolation;

a logic gate and an adjacent salicided source/drain region in a logic area;

a memory gate and an adjacent source/drain region in a memory area;

control gates on sidewalls of said memory gate isolated from said memory gate by an oxide-nitride-oxide (ONO) layer; and a local wiring through a dielectric level contacting said source/drain region in said memory area.

8. The device according to claim 7 wherein said control gates are parallel to a word line and wherein a bit line is perpendicular to said control gates and to said word line.

9. The device according to claim 7 wherein said memory gate and said logic gate comprise polysilicon underlying a tungsten/tungsten nitride layer underlying a cap nitride layer.

10. The device according to claim 7 wherein said ONO layer also underlies said control gates.

11. The device according to claim 7 wherein said ONO layer does not underlie the portion of said control gates adjacent to said source/drain region.

12. A twin MONOS memory cell array and CMOS logic device circuit integrated circuit device comprising:

a shallow trench isolation for said memory device isolation along a direction of said bit line and a shallow trench isolation for said logic device isolation;

logic gates and adjacent salicided source/drain regions in a logic area;

dual metal bit lines to contact diffusions individually on each side of a memory gate in a memory area wherein said memory gate acts as a word line;

control gates on sidewalls of said memory gate along said word line and adjacent source/drain diffusions wherein said control gates on sidewalls of said memory gate are isolated from said memory gate by a dielectric layer wherein a dielectric layer also underlies said control gates and wherein said word lines and said control gates are perpendicular to said bit lines;

alternating extensions of said contact diffusions between said word lines along a bit line direction for bit contacts wherein said extensions of said contact diffusions on one side contact one of said dual metal bit lines and on the other side contact another of said dual metal bit lines; and a local wiring through a dielectric level contacting one of said source/drain regions in said memory area.

13. The device according to claim 12 wherein said memory gate and said logic gate comprise polysilicon underlying a tungsten/tungsten nitride layer underlying a cap nitride layer.

14. The device according to claim 12 wherein said dielectric layer comprises oxide-nitride-oxide (ONO).

15. The device according to claim 12 wherein said dielectric layer does not underlie the portion of said control gates adjacent to said source/drain region.

16. A twin MONOS memory cell array and CMOS logic device circuit integrated circuit device comprising:

logic gates and adjacent salicided source/drain regions in a logic area;

memory gates and adjacent source/drain regions in a memory area;

control gates on sidewalls of said memory gates isolated from said memory gates by an oxide-nitride-oxide (ONO) layer;

word lines parallel to said control gates;

a first diffusion area on one side of said word lines wherein said first diffusion area is divided into bits by shallow trench isolation regions;

a second diffusion area on another side of said word lines wherein said second diffusion area forms a continuous diffusion line; and a metal line overlying said word lines and perpendicular to said word lines wherein said metal line contacts each of said bits of said first diffusion area and wherein said metal line acts as a bit line and wherein said metal line does not contact said continuous diffusion line and where said continuous diffusion line acts as source line.

17. The device according to claim 16 wherein said memory gate and said logic gate comprise polysilicon underlying a tungsten/tungsten nitride layer underlying a cap nitride layer.

18. The device according to claim 16 wherein said ONO layer also underlies said control gates.

19. The device according to claim 16 wherein said ONO layer does not underlie the portion of said control gates adjacent to said source/drain region.

* * * * *